US005780341A

United States Patent [19]
Ogura

[11] Patent Number: 5,780,341
[45] Date of Patent: Jul. 14, 1998

[54] LOW VOLTAGE EEPROM/NVRAM TRANSISTORS AND MAKING METHOD

[75] Inventor: Seiki Ogura, Wappingers Falls, N.Y.

[73] Assignee: Halo LSI Design & Device Technology, Inc., Wappingers Falls, N.Y.

[21] Appl. No.: 762,212

[22] Filed: Dec. 6, 1996

[51] Int. Cl.$^6$ .............................................. H01L 21/8247
[52] U.S. Cl. ........................ 438/259; 438/266; 438/270
[58] Field of Search .................................. 438/257, 259, 438/262, 264, 266, 267, 270, 588, 589, 593, 594

[56] References Cited

U.S. PATENT DOCUMENTS

| | | | |
|---|---|---|---|
| 4,531,203 | 7/1985 | Masuoka et al. | 365/218 |
| 4,561,004 | 12/1985 | Kuo et al. | 357/23.5 |
| 5,198,380 | 3/1993 | Harari | 437/43 |
| 5,376,572 | 12/1994 | Yang et al. | 438/264 |
| 5,591,652 | 1/1997 | Matsushita | 438/259 |

FOREIGN PATENT DOCUMENTS 5-260766  10/1993  Japan .

OTHER PUBLICATIONS

A. Phillips et al. 1975 IEDM Technical Digest, p. 39 "N Channel IGFET Design Limitations due to TBT Electron Trapping".
T. Ning et al. "Emission Probability of Hotelectron from Silicon into Silicon Dioxide", J. Applied Physics, 1977, vol. 48, pp. 286–293.
"A Fully Decoded 2048 Bit Electrically–Programmable MOS–ROM", 1971 ISSCC, pp. 80–81.
"FAMOS–A New Semiconductor Charge Storage Device" Solid State Electronics, 1974, vol. 17, pp. 517–529.
"Operation and Characterization of N–Channel EPROM Cell" J. Barnes et al in 1976 IEDM, pp. 177–179.
P. Salsburg, "High Performance MOS EPROM Using a Stack Gate Cell", in 1977 ISSCC, pp. 186–187.
Cheming Hu, "Lucky–electron Model of Channel Hot Electron Emission", IEDM, 1970, pp. 223–226.
G. Samachusa et al. "128K Flash EEPROM Using Double Polysilicon Technology", 1987 Journal of Solid State Circuits, vol. SC–22, No. 5, pp. 676–682.
H. Kume, "Flash–Erase EEPROM Cell with an Asymmetric Source and Data Structure", Technical Digest of the IEEE International Elec Dev Mtg, Dec. 1977 pp. 560–563.
V.N. Kynett et al, "An In–System Reprogrammable 32K×8 CMOS Flash Memory", IEEE J. Solid State Circuits, vol. 23, No. 5, Oct. 1988, pp. 1157–1162.
J. Kupec et al, "Triple Level Polysilicon EEPROM with Single Transistor Per Bit", 1980 IEDM Technical Digest, pp. 602–606.
Wu et al, "A Novel High–Speed 5–v Programming EPROM Structure with Source–Side Injection" 1986 IEDM Technical Digest, pp. 584–587.

*Primary Examiner*—Chandra Chaudhari
*Attorney, Agent, or Firm*—George O. Saile; Stephen B. Ackerman

[57] ABSTRACT

A method for fabricating an electrically programmable memory device which has efficiency of electron injection from the channel to floating gate is provided. A substrate is provided having source and drain region with a channel therebetween. A floating gate structure is formed over portions of the source and drain regions and the channel. The structure includes a dielectric layer and a conductor layer thereover. The channel under the floating gate has both horizontal and vertical components. After forming the vertical and horizontal components, an N– drain region is formed in self-alignment with the vertical channel step region's edge. The depth of the N– drain is greater than the source region.

32 Claims, 19 Drawing Sheets

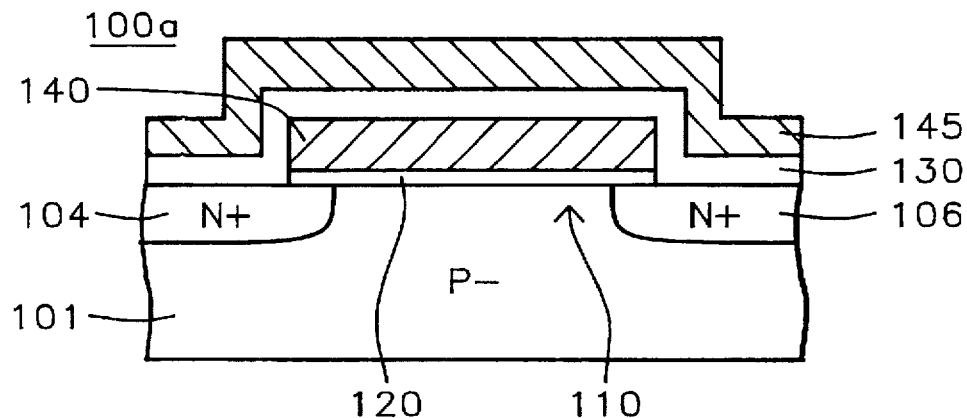
FIG. 1A - Prior Art
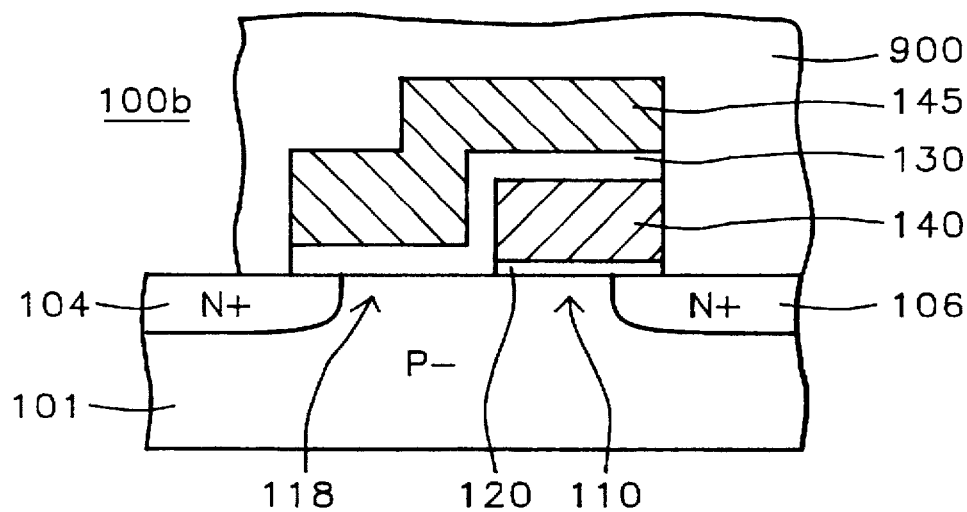
FIG. 1B - Prior Art
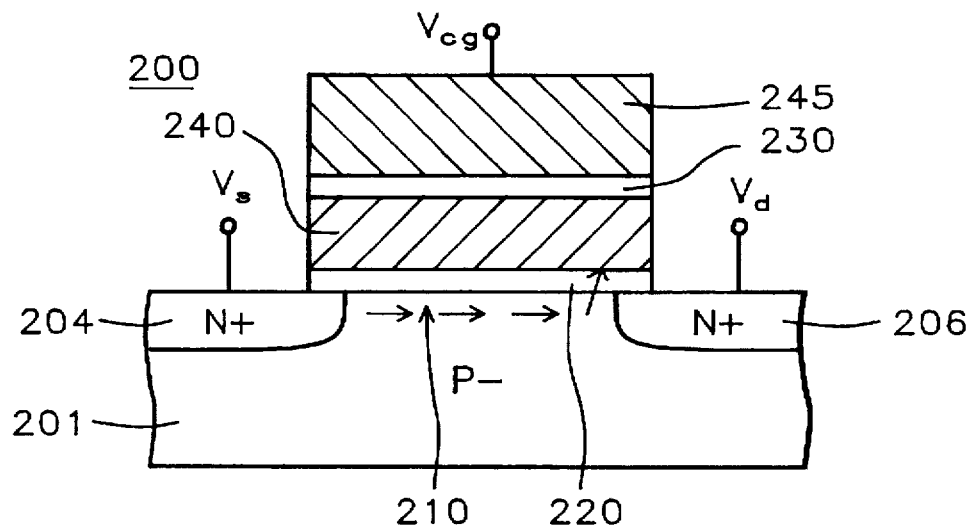
FIG. 2 - Prior Art

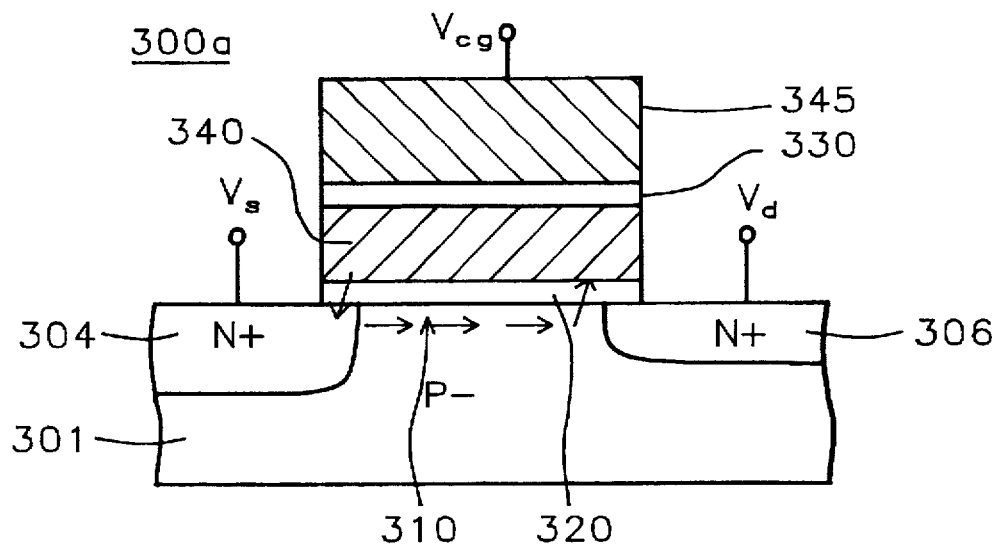
FIG. 3A - Prior Art
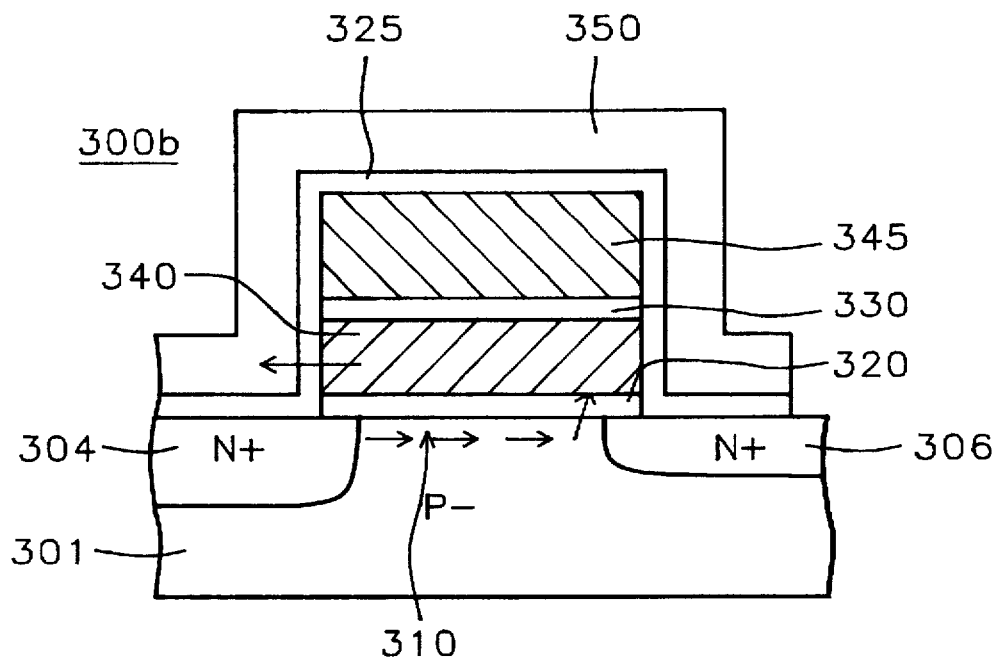
FIG. 3B - Prior Art

| Write Data | Selected Control gate | | Unselected Control gate | | |
|---|---|---|---|---|---|
| | '0' CHE Inj. | '1' Tunnel Erase | Unchange | '0' | '1' | Unchange |
| Vcg (V) | 10 | 10 | 10 | 5 | 5 | 5 |
| Vd (V) | 10 | 0 | 5 | 10 | 5 | 5 |
| Vs (V) | 5 | 0 | 5 | 5 | 0 | 5 |
| Vfg (V) | 8.3 | 3.3 | 6.7 | 6.7 | 1.7 | 5 |
| Eono in MV/cm | 1.6 | 6 | 3 | −1.6 | 3 | 0 |

LOW VOLTAGE EEPROM/NVRAM TRANSISTORS AND MAKING METHOD

BACKGROUND OF THE INVENTION

1) Field of the Invention

The invention relates to methods and resulting electrically programmable read-only memories (EPROM)and electrically erasable programmable read only-memories EPROM) device structures.

2) Description of the Prior Art

The mechanism of hot electron emission into gate oxide and gate had been identified by A. Phillips et al. in the 1975 *IEDM Technical Digest*, p. 39. Since then, the phenomena was intensively investigated by T. Ning et al. in *J. Applied Physics*, 1977, Vol. 48, p. 286, and by many other scientists. Until identification of hot electron emission, electrical programmable memories (EPROM) utilized memory structures very similar to those of Channel Hot Electron EPROM's, but which employed the avalanche breakdown mechanism to program the memory cell by Frohman-Bentchkowsky: p-channel in 1971 *ISSCC*, p. 80. "A Fully decoded 2048 bit Electrically-Programmable MOS-ROM", and n-channel in an article entitled "FAMOS -A New Semiconductor Charge Storage Device", *Solid State Electronics*, 1974, Vol. 17, p. 517. Immediately after discovery of the hot electron emission mechanism into a silicon gate, this injection mechanism was applied for programming of n-MOSFET EPROM cells by J. Barnes et al. in 1976 *IEDM*, p. 177, "Operation and Characterization of N-channel EPROM cell" and P. Salsbury in 1977 *ISSCC*, p. 186, "High Performance MOS EPROM using a stack gate cell", J. Barnes showed two basic types of the double polysilicon CHE EPROM transistors in FIG. 1A stack gate transistor 100a and FIG. 1B split gate transistor 100b. Both transistors have N+ source junction 104, N+ drain junction 106, p-substrate 101, channel gate oxide 120, floating gate 140, poly oxide 130, and control gate 145. Transistor 100b has a split channel consisting of a section 110 whose conductivity is controlled by floating gate 140 and control gate 145, in series with a section 118, whose conductivity is controlled by control gate 145. Passivation layer 900 is shown in FIG. 1B. In both type transistors 100a and 100b, programming takes place by injection of hot electron near the silicon surface and near the drain junction.

A numerical model correctly predicting hot electron emission into floating gate was established by Cheming Hu in IEDM 1970, p. 223, 'Lucky-Electron Model of Channel Hot Electron Emission'. FIG. 2 presents the cross sectional view of a typical double polysilicon stack gate EPROM transistor 200, which was used to explain his lucky model. The transistor is an NMOS transistor with source 204, drain 206, substrate 201, floating gate 240 and control gate 245. When a voltage Vcg is applied to control gate 245, over the floating gate 240 but insulated by dielectric layer 230, capacitive coupling causes the voltage of the floating gate to increase proportionally to the capacitance ratio (=coupling ratio) of Ccg-fg/(Ccg-fg+Cfg-si), where Ccg-fg is the control gate-floating gate capacitance and Cfg-si is the floating gate-channel and source/drain capacitance. Once the floating gate voltageexceeds the threshold voltage, electrons begin to flow from source to drain. The horizontal electric field due to the drain-source potential difference accelerates horizontal movement of electrons in the channel which is near to the silicon surface, typically within a 10 nm depth. The electrons gain energy and momentum from the horizontal field reaching maximum energy near the drain edge 206. A small portion of electrons obtain higher energy than the tunnel oxide (220) barrier height. When electron energy exceeds the insulator barrier height, it becomes possible that electrons may be emitted into the insulator 220 and reach the floating gate polysilicon 240 if the momentum (motion) of electrons is redirected upward to the floating gate by acoustic phonon scattering without suffering energy loss. It was observed that the probability of injection from the channel into the polysilicon is less than the orders of IE-6 to IE-9. Also the model suggested that channel hot electron emission into a floating gate would be negligible if Vd-Vs is less than 2.5 V, no matter how small the channel length or junction depth.

That the probability of channel electron onto the floating gate is so small is disadvantageous in many ways. The disadvantages in the prior art channel hot electron injection for EPROM and EPROM memory operation are:

a) The drain voltage has to be raised much higher (for example 5 V or higher) than theoretical requirement of 2.5~3 V since the probability that electrons are redirected upward by acoustic scattering is so small that many hot electrons have to be generated by increased drain voltage.

b) The control gate voltage must be high (9~10 V for a coupling ratio of 0.6~0.5), because the injected electrons require an assisting electric field to reach the floating gate polysilicon (the floating gate voltage needs to exceed the drain voltage). When the floating gate voltage is lower than the drain voltage, electrons that were injected into the oxide get repelled back to the drain.

c) The program time to store electrons onto the floating gate is long, typically on the order of micro-seconds compared to the read access time on the ten nano-second order, since the injection efficiency of electrons is less than 1E-6.

d) Since the injection current is so small and the injection current depends on both the drain voltage and the control gate voltage, it is difficult to control the level of retained electrons each time in the program cycle.

e) High voltage devices to decode the control gate are required in the memory array. The higher the control gate voltage is, the longer the channel length must be with thicker gate oxide. This induces a density penalty and becomes a major obstacle in the scaled technology.

f) Extra hot electrons due to the higher drain voltage lead to quick oxide wear out and less endurance, since the higher energy electrons damage more oxide crystal lattice and creates traps.

g) Power consumption and the drain current are high due to low injection efficiency, and the high voltage requirement for the drain and control gate.

In electrically erasable and programmable read-only memories (EPROM), electrons stored on the floating gate are removed electrically by applying the appropriate voltages to the transistor terminals. There are two erase approaches to removing electrons from the floating gate in EPROM. One approach is with the double polysilicon EPROM cell, which removes electrons from the floating gate to downward silicon (i.e., either source, drain diffusions or substrate). Another approach is with the triple polysilicon EPROM cell which removes electrons from the floating gate to a separate third gate.

The double polysilicon cell approach for EPROM is described by G. Samachusa et al., in 1987 *IEEE, Journal of Solid State Circuits*, Vol. SC-22, No. 5, p. 676, "128K Flash EPROM using double polysilicon technology". Variations of this double polysilicon cell are described by H. Kume et al. in an article titled, "Flash-Erase EPROM cell with an Asymmetric Source and Drain Structure", *Technical Digest of the IEEE International Electron Device Meeting*, December 1987. p. 560. and by V. N. Kynett et al. in an article titled, "An In-system Reprogrammable 256k CMOS Flash Memory", *Digest of Technical papers, IEEE International Solid-State Circuits Conference*, February 1988. p. 132.

A typical double polysilicon stack gate EPROM cell by H. Kume, which removes electrons from floating gate to downward silicon, is shown in FIG. 3A. Erase in double polysilicon EPROM transistor 300a is achieved through tunnel oxide 320, between floating gate 340 and source diffusion junction 304 when the electric field across the tunnel oxide exceeds the critical electric field for F-N tunneling of ~10 MV/cm. In typical voltage applications for erase, the tunnel oxide is 10 nm, the diffusion junction is 12 V, the control gate is 0 V and the drain voltage is floating. Since this approach requires high voltage on the source junction, the junction is susceptible to avalanche breakdown. In order to protect against breakdown, the source junction is made deeper than drain junction (the drain junction must kept shallow to create a high electric field at drain junction edge for Hot Channel Electron). This stack gate cell is a variation of EPROM cell 100a in FIG. 1A, but with an asymmetrical deep source junction. It is noted that the double poly split gate transistor 100b offers a junction on only one side and so cannot be used for EE applications requiring asymmetric diffusions.

The triple polysilicon transistor overcomes this problem because electrons are not removed to the junction, but to a third polysilicon. Also, the triple silicon EPROM cell is claimed to solve the density disadvantages associated with a deep junction for scaled-down memory technologies. A triple polysilicon device is described by J. Kupec et al. in 1980 *IEDM Technical Digest*, p. 602 in an article entitled, "Triple Level Polysilicon EPROM with Single Transistor per Bit". An improvement to the Kupec device was proposed by F. Masuoka and H. Izuka in U.S. Pat. No. 4,531,203 issued Jul. 23, 1985. Variations on the same cell are described by C. K. Kuo and S. C. Tsaur in U.S. Pat. No. 4,561,004 issued Dec. 24, 1985 by A. T. Wu et al., in the 1986 *IEDM Technical Digest*, p. 584 in an article entitled, "A Novel High-speed, 5- V Programming EPROM structure with source-side injection", and by E. Harar in U.S. Pat. No. 5,198,380 issued Mar. 30, 1993.

All of these various triple polysilicon memory cells utilize one of the polysilicon levels as an erase gate. An erase gate passes through each memory cell transistor closely adjacent to the surface of the floating gate, but insulated therefrom by a thin tunnel dielectric. Charge is then removed from the floating gate to the erase gate, when appropriate voltages are applied to all of the transistor elements. Among various triple polysilicon EPROM cells, the EPROM transistor 300b with the third polysilicon for erase by Kupec is shown in FIG. 3B. In transistor 300b, electrons stored on the floating gate 340 are removed from the side wall of the floating gate to the third polysilicon 350. Typical voltages applied to each node during erase are the following: 12–15 V on the triple erase polysilicon for 20 nm ONO 325, and 0 V for the second polysilicon of control gate 345 and the diffusion junctions of 304 and 306. The highest junction voltage is about 5 V on the drain, during program. Thus junction avalanche breakdown and junction leakage problems do not exist in the triple polysilicon EPROM transistor. The solution of a triple polysilicon transistor has its own cost however. The disadvantages:

a) Extra process steps to build a triple polysilicon structure involve extra depositions of polysilicon for erase, and a dielectric layer for tunnel erase. Extra complicated structures and masking steps are also involved to selectively remove electrons from the floating gate to erase polysilicon, not to tunnel from the erase gate to control gate polysilicon. This penalizes not only an increase in process complexity, but also the memory cell density.

b) Extra circuitry to generate the erase voltage is required. In order to minimize the impact of extra circuitry on density, the block size of erase must be relatively large. Large block size of erase reduces the overall lifetime of the memory array, since the large block size increases unnecessary program and erase cycles.

SUMMARY OF THE INVENTION

This invention relates to an improvement for electrically programmable readonly memories (EPROM) and electrically erasable programmable read only-memories (EPROM), specifically to device structures and operating techniques to effectively utilize the structure for extended applications in non-volatile memories. The invention also relates to methods for making such device structures.

An electrically programmable read-only memory (EPROM) utilizes a floating (unconnected) conductive gate in a field effect transistor structure, positioned over but insulated from, a channel region on a semiconductor substrate, between the source and drain regions. A control gate is provided over the floating gate, but also insulated therefrom. The memory state is determined by the amount of charge retained on the floating gate, which controls the threshold characteristics of the transistor. The mechanism of the charge storage phenomena in channel hot electron (CHE) is explained by the following.

When a voltage is applied to the control gate which lies over the floating gate, capacitive coupling from the control gate to floating gate increases the floating gate potential. Once the floating gate voltage exceeds the threshold voltage, electrons begin to flow from source to drain. A horizontal electric field due to the drain-source potential difference accelerates the horizontal movement of electrons in the channel, which is near to the silicon surface. The electrons gains energy and momentum from the field and reach maximum energy at the drain's edge. Electron energy level increases for higher drain voltages. When electron energy exceeds the insulator barrier height, it becomes possible that electrons may be emitted into the insulator and reach the floating gate polysilicon, if the momentum (motion) of electrons is upward to the floating gate. This probability is very small though, which results in low efficiency and long program time. Once electrons are injected and stored onto the floating gate, the threshold voltage of the memory cell has been increased.

The state of a memory cell transistor is read by placing a voltage across its source and drain, and on its control gate, the same way a normal MOSFET transistor is operated. The amount of current flow between the source and the drain is influenced by the threshold voltage, namely, the amount of stored electrons. The more electrons that are stored on the floating gate, the higher the threshold voltage, and the lower the current. The state of the memory is determined by the current level. Only a small portion of channel electrons are injected onto the floating gate, typically one out of millions. Programming time to inject electrons onto the floating gate is very slow, compared to the read time of the same memory transistor. In order to improve the program time, high drain and control gate voltages are employed in EPROM and flash EPROM cells. The requirement of high voltage is a major obstacle to scaling down the memory array.

It is the primary object of the present invention to provide a new memory cell configuration and structure which improves, by many orders of magnitude, the electron injection efficiency.

It is another object of the present invention to provide a new memory cell configuration and structure which allows reliable, programming and reliable erasing from the same drain Junction.

It is another objective of the present invention to reduce the drain and control gate voltages necessary for electron injection, to allow future scaling of the memory cell and high density memories, as well as improve reliability and endurance of the memory cell.

It is another objective of the present invention to provide faster programming time to attain the target level of electron storage, which, when combined with the controllability of electron injection, makes applications of multi-level/multi-bit storage on a single memory transistor, more effective.

It is another objective of the present invention to provide a feature for EPROM function in a single polysilicon cell with a new structure and operating techniques of program and read for that single polysilicon cell.

It is another objective of the present invention to provide an operating technique for tunneling erase from the floating gate to the control gate, by utilizing a feature of the new structure as a double polysilicon EPROM cell instead of the triple polysilicon EPROM in prior art.

It is another objective of the present invention to provide a feature for Non-Volatile RAM function in a split gate cell with a new structure, and to provide an operating technique to write '0' (program) or '1' (erase) for a selected word line(control gate).

It is another objective of the present invention to provide simpler and more controllable processes to manufacture EPROM's, flash EPROM's and nonvolatile memory applications.

These and additional objects are accomplished by the various aspects of the present invention, either alone or in combination, the primary aspects being briefly summarized as below:

The problems associated with prior art channel hot electron injection types of EPROM and EPROM are overcome by providing a step channel/drain structure, which adds a vertical channel/drain component under the floating gate to a previously horizontal channel structure. The efficiency of electron injection from the channel to the floating gate is enhanced by many orders of magnitude, because electrons accelerated in the horizontal channel penetrate directly, in the direction of movement, into the vertical component of the floating gate, in contrast, prior art relied on the indirect process of electron scattering by phonon and the 90 degree redirection of motion upward to the floating gate. With the feature of vertical injection step, high injection efficiency decreases programming time, which also makes multi-level storage easier and more controllable, and allows operation at much lower voltages and improves reliability and overall process complexity.

A single polysilicon EPROM cell is achieved, distinguished from the prior art double polysilicon cell at low voltage programmability of as low as 5 V, utilizing the first embodiment of this invention of a step channel/drain structure by simply adjusting the overlap drain region to be slightly longer than the horizontal channel length. The simplicity of the structure and its manufacturing process, as well as its low operating voltage makes the EPROM compatible with logic or DRAM and provides wider application such as integration of EPROM onto a logic chip, orredundancy personalization to replace aluminum or polysilicon fuses on a DRAM chip.

In a double polysilicon EPROM transistor with a step channel/drain structure, a new feature of reliable erase and program operations at the same of junction is achieved by adjusting the N-drain length longer, junction depth deeper, and dosage lighter, to withstand the high voltage needed to induce tunneling from the floating gate to diffusion without adversely affecting the injection efficiency very much. In the prior art EPROM cell, a reliable erase operation by tunneling to diffusion is only implementable at the deep source side junction, and not at the shallow drain junction which is used for programming. Therefore a split gate structure, as well as a stack gate structure, can be adapted to use this new feature, otherwise same side erase and program is impractical since the split gate cell has only one junction next to the floating gate.

Another new feature for erase operation by tunneling from the floating gate to the control gate in a double polysilicon EPROM transistor with a step channel/drain, is also enabled by adjusting the length of overlapped floating gate over the N-drain diffusion. In prior art, electron removal from the floating gate to another polysilicon by tunneling required a triple polysilicon structure instead of double polysilicon in an EPROM transistor. This new double polysilicon EPROM transistor feature provides a shallower drain junction (compared to tunneling from floating gate to diffusion), reduced process complexity (double polysilicon vs. triple polysilicon), smaller erase block size such as by word line (control line) level, and extended endurance due to reduction of unnecessary program/erase cycles, resulting from the size of the large block erase.

Non-volatile RAM operation using a split gate double poly transistor with a step channel/drain structure, not achievable in prior art EPROM, is enabled by combining the operating features of low voltage programming and poly to poly tunnel erase. The nature of Random Access Memory is the capability to write "0"'s (program) and "1"'s (erase) to different transistor locations at the same time, for an electrically connected and selected control gate. With proper design and application of voltages on the drain and the source, RAM functionality can be achieved for a split gate double poly transistor with a step channel/drain structure. This double polysilicon split gate transistor with injection step channel will find much wider application since it behaves like RAM but is also non-volatile. Also, the bit by bit program and erase capability extends the endurance of program/erase cycles, as well as improves program/erase time.

A triple polysilicon EPROM transistor with an arbitrary vertical floating gate channel in series with a horizontal channel (without N-drain region but with vertical channel) is provided, which is a variation of the double polysilicon EPROM transistor with a step channel/drain and utilizes the same concept of high injection efficiency due to straight injection of electrons, in the direction of movement, into the vertical component of the floating gate.

A prime objective of this invention, is to demonstrate the manufacturability of the step channel device structure. A simple method to fabricate the step channel with self aligned N-drain to the step is first shown, in which the floating polysilicon gate to cover the step channel in a non-self aligning process. Utilizing this simple method to create a step, basic processes to fabricate stack and split gate transistors in EPROM/EPROM are also shown.

An alternative fabrication method for split gate transistors is provided in which the channel and step lengths under the floating gate can be accurately fabricated, and misalignment is practically eliminated by fully utilizing spacer techniques.

BRIEF DESCRIPTION OF THE DRAWINGS

FIG. 1A is a cross section of the stack EPROM prior art cell which programs by injecting channel hot electrons into the floating gate.

FIG. 1B is a cross section of the split EPROM prior art cell which programs by injecting channel hot electrons into the floating gate.

FIG. 2 is a cross section of the stack EPROM prior art cell which is used to explain 'Lucky-Electron Model' of injecting channel hot electrons into the floating gate.

FIG. 3A is a cross section of the stack EPROM prior art cell which erases by tunneling of electrons from the floating gate to the source diffusion.

FIG. 3B is a cross section of the flash EPROM prior art cell with triple polysilicon which erases by tunneling from the floating gate to an erase gate.

FIG. 11G is a crossectional view taken along the line 11G-11G' of FIG. 11H.

FIG. 13G is a crosssectional view taken along the line 13G-13G' of FIG. 13H.

DESCRIPTION OF THE PREFERRED EMBODIMENTS

EPROM N-CHANNEL TRANSISTOR WITH STEP INJECTION CHANNEL AT DRAIN EDGE

Figure 4A:
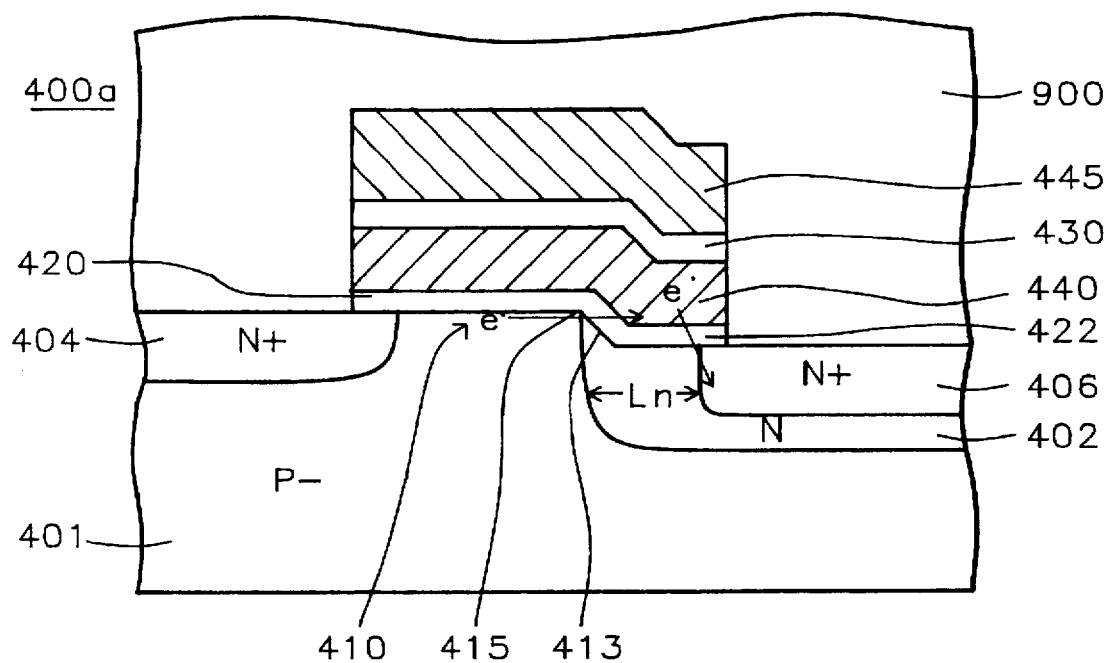
FIG. 4A is a cross section of the stack gate EPROM cell with a step channel/drain structure, in accordance with the first embodiment of this invention wherein channel hot electrons are injected straight in the direction of the moving electrons, into the floating gate through the side wall channel oxide. In the third embodiment of this invention, electrons on the floating gate are removed by tunneling from the floating gate to the step drain diffusion.
Figure 4B:
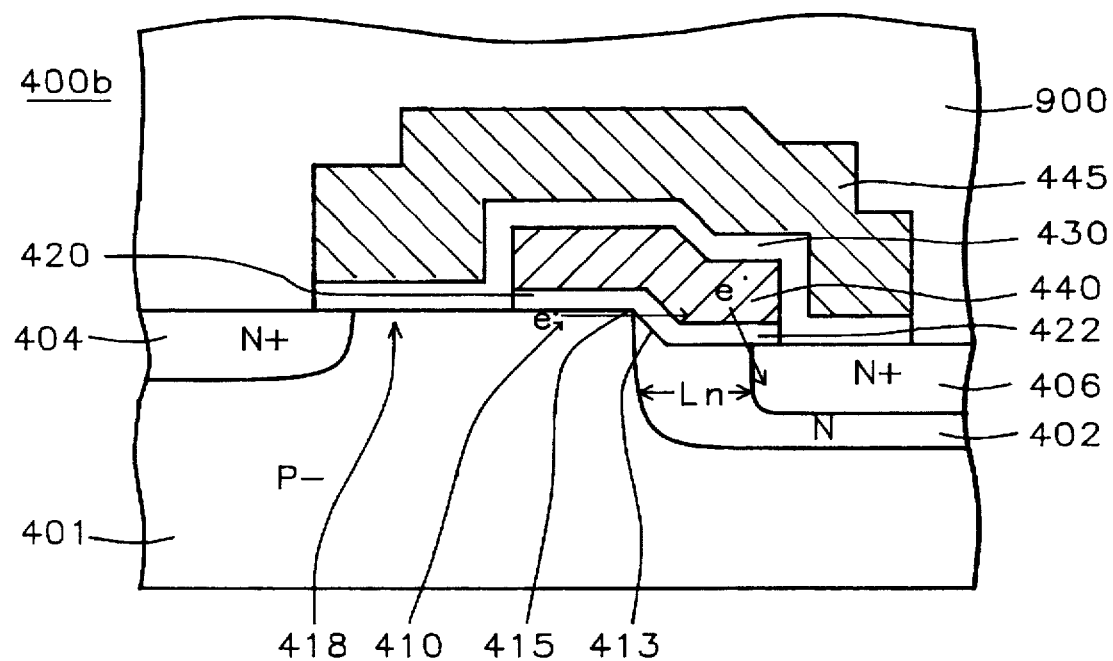
FIG. 4B is a cross section of the split gate EPROM cell with a step channel/drain structure, in accordance with the first embodiment of this invention wherein channel hot electrons are injected straight in the direction of the moving electrons, into the floating gate through the side wall channel oxide. In the third embodiment of this invention, electrons on the floating gate are removed by tunneling from the floating gate to the step drain diffusion.

FIGS. 4A and 4B show cross-sectional views of a step injection channel transistor in accordance with this first embodiment of this invention. Transistor 400a in FIG. 4A has a p-type silicon substrate 401 (which can alternatively be a p-type epitaxial layer grown on top of a p+ doped silicon substrate), N+ source diffusion 404, a horizontal channel region of 410, a step channel 413, a drain diffusion 406, a control gate 445, and a floating gate 440 which uniformly covers both the horizontal and step channel. The floating gate is dielectrically isolated from the surface of the silicon substrate by dielectric film 420, which is thermally grown dioxide. Control gate 445 is capacitively coupled to floating gate 440 through dielectric film 430, which can either be thermally grown silicon dioxide or a combination of thin layers of silicon dioxide and silicon nitride. P-type 401 is typically doped in the range of between about 1E16cm-3 to 5E17cm-3, dielectric film 420 is typically 5 to 10 nanometers thick, floating gate 440 is usually a heavily N+ doped film of polysilicon of a thickness which can be as low as 100 nm or as high as 300 nm. Control gate 445 is either a heavily N+ doped film of polysilicon or a low resistivity interconnect material like silicide, or another refractory material. Passivation is shown by layer 900 which can be composed of known dielectrics such as silicon oxide, silicon nitride, silicon oxynitride or combinations thereof N+ source diffusion 404 is formed by ion implantation of Arsenic, Phosphorus, or Antimony. N+ drain 402 is formed by the same ion implant material, but self-aligned to step channel edge 413, immediately after formation of step and prior to formation of oxide layer 420.

Figure 4C:
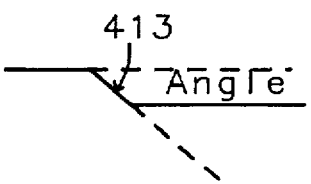
FIG. 4C is an illustration of the angle measurement of the step, which is measured from the channel silicon surface and is appropriately larger than 30 degrees, due to density considerations.

The angle of the step measured from the horizontal plane of the original silicon surface as illustrated in FIG. 4C, is not critical as long as a reasonable area of more than 20 nm in vertical depth is exposed for injection. If the angle is too small, the length of step channel region gets too long, which is a density penalty. Therefore it is reasonable that the step angle will be greater than 30 degrees. The depth of this step 413 is at least 20 nm or larger. The purpose of the step 413 is to inject hot electrons more efficiently onto floating gate 440.

When a proper voltage level is applied to control gate 445, the floating gate potential which is capacitively coupled to the control gate becomes higher than the threshold voltage in the horizontal channel region 410 and electrons are supplied into channel from source junction 404. The electrons are then accelerated by the horizontal drain field, as in a MOSFET transistor, when the drain diffusion 406 is biased with a positive voltage. Electrons flow near the silicon surface within an inversion layer of horizontal channel region 410 (typically within 10 nm). If the N-drain covers the corner of channel 415 with proper doping concentration (typically in the order of 1E18 per cm-3), maximum electric field can be created near the corner 415, along the side channel 413, which becomes the injection point because the electrons reach maximum speed and the momentum of the electrons is still close to horizontal. When the energy level of electrons gained in the channel transport is higher than the barrier height (3eV for silicon dioxide) and the floating gate potential is higher than the potential at the corner 415, the high energy electrons penetrate straight into the floating gate. In contrast, prior art relied on the indirect process of electron scattering by phonon and the 90 degree upward redirection of motion to the floating gate without suffering energy loss in conventional CITE EPROM. Thus the configuration of this invention's step structure enhances the efficiency of electron injection from the channel to the floating gate by many orders magnitude.

When the floating gate voltage due to storing electrons becomes lower than the threshold voltage, channel current is shut off. During read mode, in order to avoid possible injection onto the floating gate due to a voltage surge on the drain from power noise, it is preferable to switch the drain and the source, namely to use the step side as the source and the other terminal as the drain. To summarize the conditions to achieve high injection efficiency at low voltage in Channel Hot Electron Program using step drain/channel EPROM transistor:

Structural Conditions:

(1) The step depth should be at least 20 nm or larger and the angle from the horizontal channel plane is preferable larger than 30 degrees.

(2) The drain junction edge prefers to extend to the channel corner, but the p-type step channel achieves high injection efficiency.

Operational Conditions:

(1) The potential (referenced to source junction) at the injection point of channel corner at step should be higher than 2.5~3.0 V.

(2) The floating gate potential should be at least greater than the potential at the injection point corner.

Compared to prior art EPROM, the present invention of EPROM structure has a high efficiency injection of hot electrons onto the floating gate, obtained by a drain voltage of around 3 V, which is significantly lower than the 5 V required for the low injection efficiency of prior art EPROM cells. Therefore the control gate voltage required for the present invention EPROM cell is proportionally reduced from 9 v to 5 v. High injection at lower voltage eliminates all the disadvantages listed in the section, "Description of Prior Art".

The drain voltage of the present invention can be as low as the theoretical limit of 2.5~3.0 V which is almost half of the prior art EPROM requirement, since enough hot electron emission is already achieved by the high injection efficiency. The control voltage for the present invention is also reduced proportionally to the reduction of drain voltage, which is almost halved.

The program time to store a target level of injection electrons onto the floating gate can be reduced, due to high injection efficiency by the present invention.

Multi-level storage on the floating gate becomes easier since the program time to achieve the target level set by the control gate voltage is shorter.

Reliability and Endurance of the memory cell are enhanced as electric fields do not have to be as high as they did to write hot electrons in prior art EPROM cells.

The oxide thickness and the channel length of high voltage periphery circuits can be significantly reduced due to the reduced voltage requirement for the control gate.

The power consumption during programming is improved by many orders of magnitude, due to high injection efficiency and lower voltage operation, a very attractive feature in portable operation.

SINGLE POLYSILICON N-CHANNEL, EPROM TRANSISTOR WITH STEP CHANNEL/DRAIN AND THE OPERATION

Figure 5A:
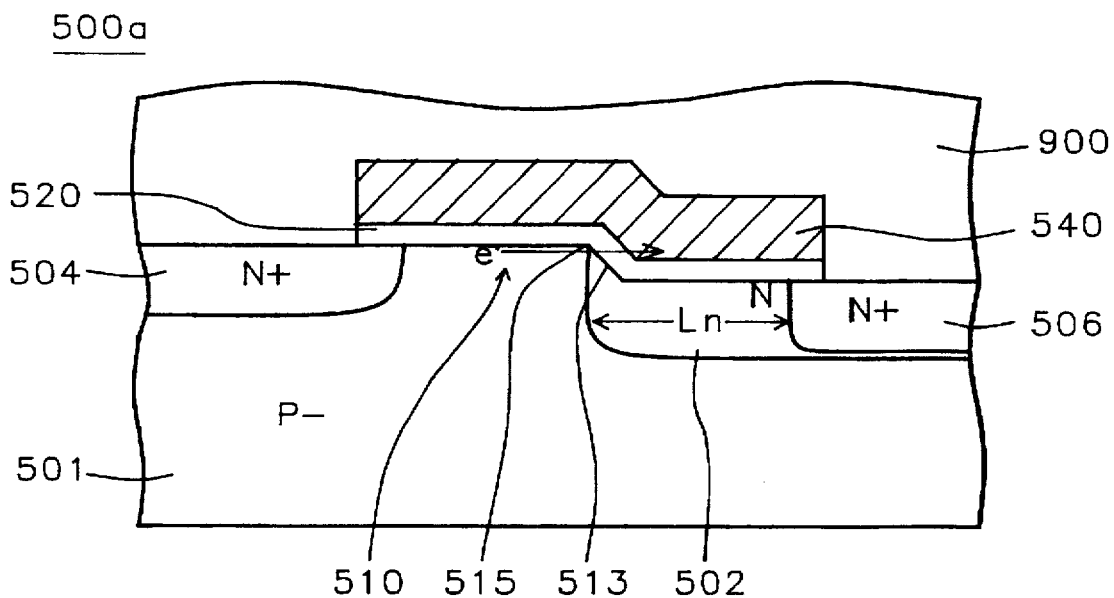
FIG. 5A is a cross section of the single polysilicon EPROM cell with a step channel/drain structure in accordance with the second embodiment of this invention wherein channel hot electrons are injected straight in the direction of the moving electrons, into the floating gate through the side wall channel oxide.
Figure 5B:
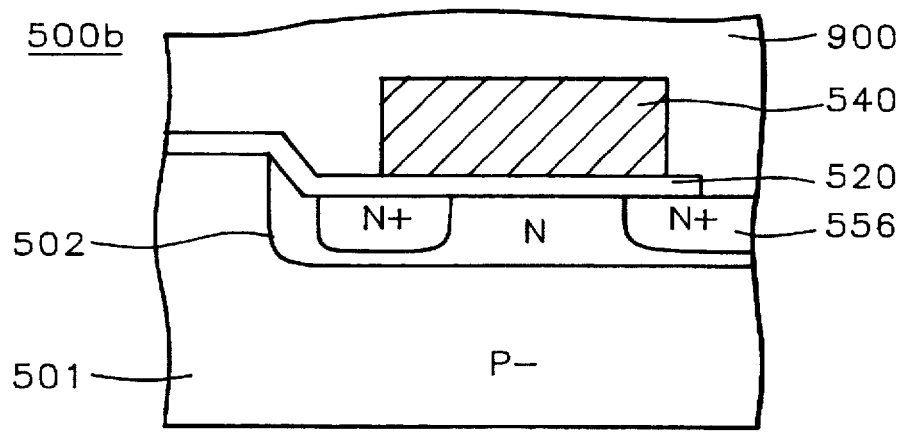
FIG. 5B is a cross section of a capacitor wherein the polysilicon gate is electrically connected to the floating gate polysilicon of the EPROM cell in FIG. 5A providing control/select gate function.
Figure 5C:
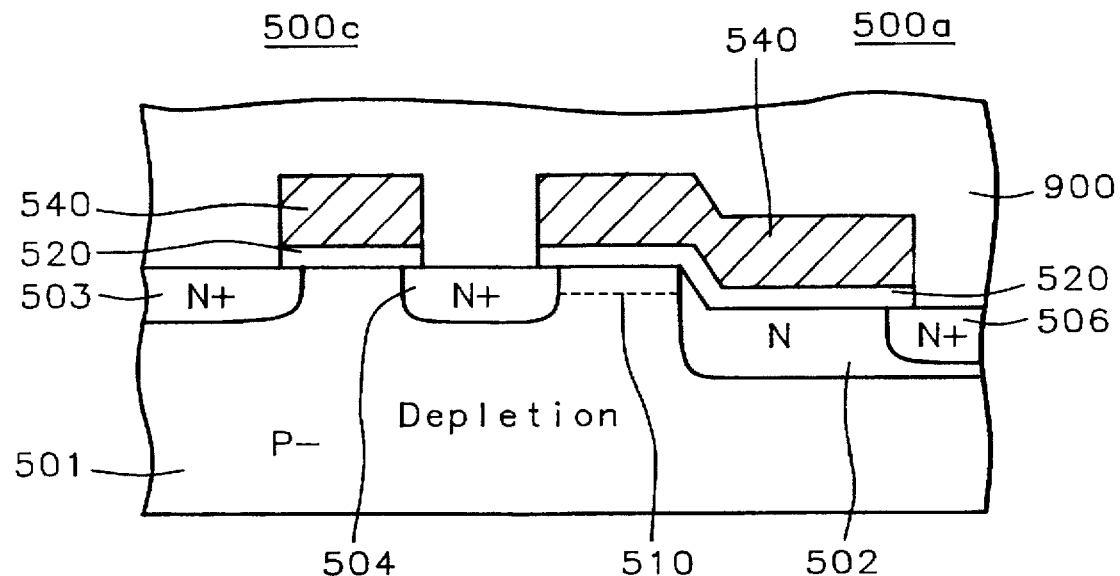
FIG. 5C is a cross section of the EPROM memory cell wherein the EPROM transistor 500a in FIG. 5A is in series to a normal FET transistor 500c which provides the select function of memory transistor.

Utilizing the prime objective of this invention of a step injection channel/drain, a single polysilicon n-channel EPROM cell distinguished from prior art by low voltage programmability is achieved. Low voltage operation of less than 5 V is attractive since the processes needed for high voltage devices with thick oxide and drain engineering can be eliminated. FIGS. 5A, 5B and 5C presents cross-sectional views of a single polysilicon n-channel EPROM transistor in accordance with a second embodiment of this invention. The transistor is a modification of transistor 400a, in which the second polysilicon has been eliminated, and the dimension of the gate overlapping the drain Ln region has been adjusted. Transistor 500a has p-type substrate 501, N+ source diffusion 504, a channel region of horizontal 510, step 513, N-drain diffusion 502, N+ drain 506, and a floating gate 540 which uniformly covers both the horizontal and step channels. Floating gate 540 is dielectrically isolated from the surface of the silicon substrate by dielectric film 520, which is thermally grown dioxide. The passivation layer 900 is the same as mentioned during the first embodiment. For enhanced devices, p-type 501 is typically doped in the range of 1E16cm-3 to 5E17cm-3. The dielectric film 520 is typically 5 to 10 nanometers thick, and the floating gate 540 is usually a heavily N+ doped film of polysilicon with a thickness range of 100 nm to 400 nm. N+ source diffusion 504 is formed by ion implantation of Arsenic, Phosphorus, or Antimony. N drain 502 is formed by the same implant material, but self-aligned to the step channel edge 513 immediately after formation of the step, and prior to formation of oxide layer 520. The concentration of 502 under the floating gate region is in the range of 1E18~5E19cm-3, slightly lower than diffusion junction 504/506's concentration, which is greater than 5E20 cm-3. The angle of the step, measured from the horizontal plane, is preferable larger than 30 degrees. The depth of step 513 is 30 nm or more. The purpose of step 513 is to inject hot electrons more efficiently onto floating gate 604, at the corner of step channel 515.

The program conditions of electron injection onto floating gate are the same as described in the first embodiment, "EPROM N-channel transistor with step channel at drain edge": (1) The potential at the injection point 515>2.5 V~3.0 V and (2) the floating gate potential 2.5 V~3.0 V is higher than the voltage at the injection point. The first condition (1) is easily achieved by applying a drain voltage greater than 3 V. The second condition in which the floating gate potential must be greater than 2.5 V~3.0 V, can be obtained by two approaches. The first approach specifies that the length of Ln (502) be slightly longer than the horizontal channel region length (510), which increases the drain-to-floating gate coupling capacitance. In this case, when 5 V is applied to the drain 506, the floating gate voltage reaches 2.5 V~3.0 V. It is also helpful to offset the junction edge of 502 from the injection point 515 to bottom step corner, so that the potential at the injection point stays about 3 V. The second approach forms coupling capacitance 500b outside of the EPROM transistor as shown in FIG. 5A with the gate of capacitor 541 being the same polysilicon as floating gate 540 and connected electrically each other. In the second approach, the Ln length can be minimal, since the floating gate voltage is rasied by coupling from the external capacitor. The area of coupling capacitance is designed to be slightly larger than the EPROM transistor gate area, to achieve a coupling ratio of 0.6. Thus when 5 V is applied to the diffusion of the capacitor junction 556, the floating gate potential becomes ~3 V coupled through the capacitor. Once conditions (1) and (2) are met, the channel hot electrons are efficiently and directly injected onto the floating gate without the redirected injection by phonon scattering of very low injection efficiency.

In the second approach, the external capacitor acts in the same function on the control gate in the double polysilicon EPROM memory cell. In the first approach, the transistor has a function of storage but it does not have a function of select. Therefore, in order to use this device as an EPROM memory cell, a conventional n-channel FET device 500c is added in series to this single EPROM transistor 500a as shown in FIG. 5A. The gate of the conventional FET transistor 500c provides the select function (control gate) to access the information on the storage transistor 500a. In this approach, the storage EPROM transistor is normally 'on' (depletion device by implanting the channel region 510 with Arsenic or phosphorus, concentration of 5E16 to 5E17/cm3). After storing injected electrons, the threshold voltage is increased and the 'off' condition is obtained.

Utilizing the prime objective of this invention of a step injection channel/drain, a single polysilicon n-channel EPROM cell distinguished from prior art by a step injection channel, provides low voltage programming as low as 5 V. The advantages obtained from this single poly EPROM are (i) the elimination of the double polysilicon requirement, (ii) the elimination of high voltage devices (iii) EPROM compatibility with Logic or DRAM due to process simplification from this elimination of double polysilicon and high voltage devices (iv) wider application such as integration of EPROM onto a logic chip, as well as redundancy personalization to replace fuses on a DRAM chip.

ELECTRICAL ERASE BY TUNNELING FROM FLOATING GATE TO DIFFUSION IN DOUBLE POLYSILICON EPROM WITH STEP CHANNEL/DRAIN

In the double polysilicon EPROM, erase accomplished by electron tunneling from the floating gate to diffusion, and a new feature of erase and program at the same step drain-diffusion, is a third embodiment of this invention. Transistor 400a in FIG. 4A, is a modification of the double polysilicon EPROM transistor 300a in FIG. 3A, in which the drain junction is replaced by a step channel/drain, and the depth of source junction 404 is reduced. The source junction depth can be reduced because erase is done at the side of the step channel/drain instead of the source side. The step junction is also already equipped with a lightly doped junction for an improved ability to withstand 10–12 V before breakdown. Transistor 400b in FIG. 4B is a split gate version of EPROM which uses the tunnel erase to diffusion, something that could not be achieved in prior art. In prior art, tunnel erase to diffusion wasn't possible because erase and program must be done at the same junction, and the requirements for both operations were not compatible. Both transistors 400a and 400b consist of a p-type silicon substrate 401, N+ source diffusion 404, a channel region of horizontal 410 of which conductivity is controlled by floating gate 440, a control gate 445, a step 413, a N-drain diffusion 404, N+ drain diffusion, a floating gate 440 uniformly covering both the horizontal and step channel, and a control gate 445. Split gate 400b has an extra channel region 418 the conductivity of which is controlled by control gate 445 in series with a section of channel 410. The floating gate is dielectrically isolated from the surface of the silicon substrate by dielectric film 420, which is thermally grown dioxide. Control gate 445 is capacitively coupled to floating gate 440 through dielectric film 430, which can be either thermally grown silicon dioxide or a combination of thin layers of silicon dioxide and silicon nitride. P-type 401 is typically doped in the range of 1E16cm-3 to 5E17cm-3, dielectric film 420 is typically 5 to 10 nanometers thick, floating gate 440 is usually a heavily N+ doped film of polysilicon, the thickness of which can be as low as 100 nm or as high as 300 nm. Control gate 445 is either a heavily N+ doped film of polysilicon, low resistivity interconnect material like silicide, or a refractory material. N+ diffusions 404 and 406 are formed by ion implantation of Arsenic, Phosphorus, or Antimony. N-drain 402 is formed by the same ion implant material, but self aligned to step channel edge 413, immediately after formation of the step, and prior to formation of oxide layer 420. The N-junction 402 for 10 V erase is typically doped in the range of 1E17 to 1E18 cm-3 and its depth is chosen to be 250 to 300 nm, which is slightly deeper than the source junction of 150 to 200 nm.

Explanation and requirements for programming are identical to those provided in the section of I. a., "EPROM n-channel transistor with step channel at drain edge". The angle of the step measured from the horizontal plane is generally greater than 30 degrees. The depth of this step 613 is at least 30 nm. The purpose of the step 413 is to inject hot electrons more efficiently onto floating gate 440 at the corner of step channel 415.

The erase operation is basically the same as explained for transistor 300a, which is the most commonly used transistor in industry practice. Assuming a tunnel oxide 410 of 9 nm, an ONO of 20 nm and a coupling ratio of 0.55, when ~10 V is applied to the drain junction and 0 V is applied to the control gate in either transistor 400a and 400b, the electric field across the oxide 422 exceeds the critical value of F-N tunneling, which is ~10 MV/cm. Electrons stored on the floating gate are then released to drain junction by F-N tunneling, which is implemented at the source side in transistor 300a, but at the drain side in this step channel/drain transistor. Since this approach requires high voltage on the drain junction, the drain junction is susceptible to the avalanche breakdown. In order to protect against breakdown during erase, the N-junction 402 is lightly doped and deeper than source junction 404. Thus, by following these design contraints, the invention of an operation of program and erase using the same step channel/drain junction is achieved. Also a split gate structure as well as a stack gate structure is able to be implemented with a double polysilicon EPROM transistor by this invention.

ELECTRICAL ERASE BY TUNNELING FROM FLOATING GATE TO CONTROL GATE IN DOUBLE POLYSILICON EPROM WITH STEP CHANNEL

In the explanation of prior art, electron removal from a floating gate to other polysilicon by tunneling required a triple polysilicon structure. It was found that in a double polysilicon cell, when high voltages were applied to the control gate of stack or split gate transistors, the voltage induced on the floating gate was in prior art, designed to be more than half of the control gate voltage. Since the bottom tunnel oxide thickness is less than half of the above dielectric NO, the electric field across the bottom tunnel oxide is actually more than four times greater than that for the above NO, which means the tunnel starts first upward at the bottom oxide and programming instead of erasing occurs. Therefore, a third polysilicon was introduced specifically to erase by tunneling between a floating gate and the third erase gate. However, when the step channel/drain transistor of this invention is used, an appropriate NO thickness and an appropriate LNG length for the floating gate over step diffusion is chosen, tunnel erase from floating gate to control gate is safely achievable for the double polysilicon EPROM with step channel.

Another new feature of erase operation from the floating gate to the control gate in a double polysilicon EPROM transistor with step channel/drain is a fourth embodiment of this invention. In double polysilicon EPROM transistors 600a and 600b, requirements of electrical erase and program are (i) tunnel gate oxide 620 is in the range of 5 to 10 nm (ii) dielectric 630 such as ONO or nitrided oxide is about equal to or thicker than tunnel oxide, typically 8 to 15 nm and (iii) the lengths of channel region 610 and overlap diffusion Ln 602 are roughly the same.

Typical critical electric fields for tunneling from polysilicon to polysilicon through ONO, which is a thermal oxide over polysilicon or CVD deposited oxide/nitride, are reported to be about 6 MV/cm (lower when compared to the electric field for a thermally grown substrate oxide of 10 MV/cm in E. Harari and F. Masuoka). Therefore, the electric field across dielectric 630 must be more than 6 MV/cm for tunnel erase from the floating gate to the control gate. On the otherhand, the electric field across the ONO during channel hot electron injection must be maintained to be less than 3 MV/cm, considering process noise margins and residual charge. In transistors 600a and 600b, operation and design of the double polysilicon EPROM are illustrated using a simple model. A simplified capacitance model for transistors 600a and 600b is provided in FIG. 7A. The capacitor Ccg-fg is the capacitance between the control gate 645 and the floating gate 640. Cfg-Ln is the capacitance between floating gate 640 and the underneath n-diffusion region 602. Cfg-ch is the capacitance between the floating gate 640 and the channel region 610 (in more accurate predictions, source to floating gate overlap capacitance in Cfg-ch also needs to be included for the stack gate cell). Here all three capacitances are chosen to be equal, which makes the explanation easier, but the assumption is also practical and reasonable. When a voltage is applied to any terminal node, one third of the voltage is induced onto the floating gate node by capacitive coupling and the induced voltage is superimposed. The program conditions of electron injection onto the floating (gate are, as described in first section above (1) the floating gate voltage >3 V and (2) the injection point potential >2.5~3.0 V. Based on the assumption that all three capacitances are equal (flat channel length=Ln), when 5 V is applied to the control gate and drain node, the floating gate voltage becomes 3.3 V due to capacitive coupling, which satisfies the program conditions. Take for example, a tunnel gate oxide of 8 nm and an ONO of 11 nm. The potential across the ONO of 11 nm is 1.7V=5 V-3.3 V, and the electrical field is 1.55 MV/cm (=1.7 V/11 nm). Even if the control gate is 5 V and the source/drain are grounded, the floating voltage is 1.7 V, and the electric field across the ONO is 3 MV/cm (=3.3 V/11 nm). So during programming, the electric field across the ONO is maintained less than 3 MV/cm, which is a design target. For the erase operation, the control gate voltage is further increased while the source and drain are kept zero. When the control gate voltage is raised to 10 V, the induced floating gate voltage is 3.3 V due to capacitive coupling, and the voltage across the ONO is 6.7 V=10 V-3.3 V. The electric field across the ONO becomes 6 MV/cm (=6.7 V/11 nm), which satisfies the target of electron tunneling from floating gate polysilicon to control gate polysilicon. Thus 10 V erase for poly to poly tunneling as well as 5 V programming for channel hot electron injection is achieved. These voltage requirements for erase are almost the same voltage levels required in prior art for a triple polysilicon EPROM cell.

Figure 6A:
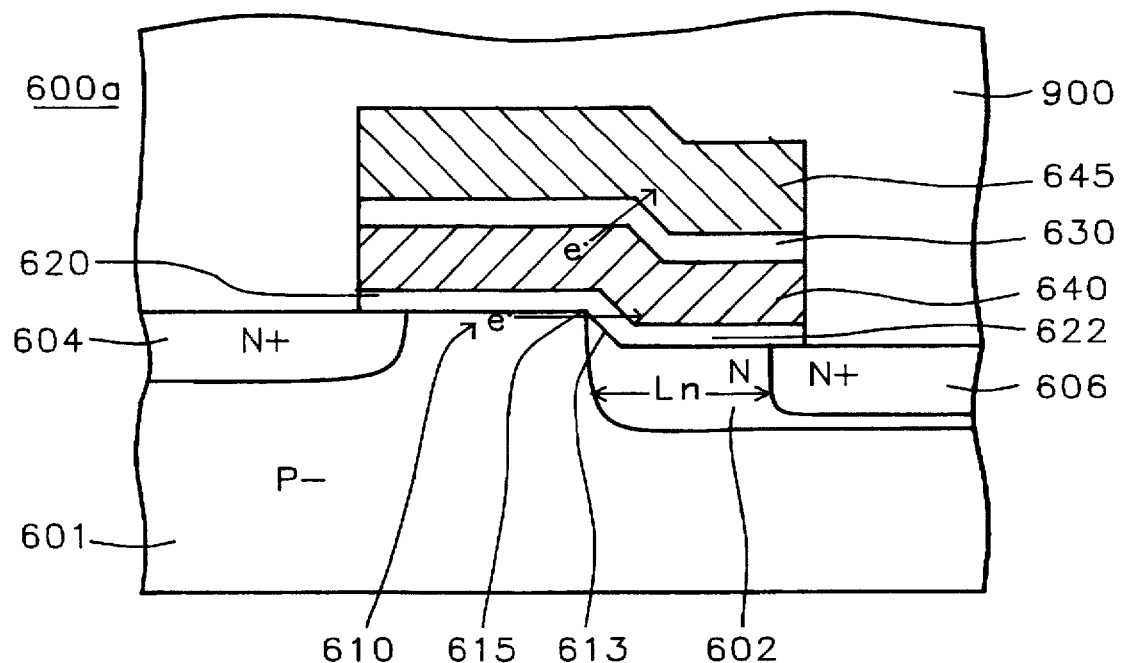
FIG. 6A is a cross section of the stack gate EPROM cell with a step channel/large overlapped drain structure designed for another feature of tunnel erase, in accordance with the fourth embodiment of this invention wherein electrons on the floating gate are removed by tunneling from the floating gate to the control gate, in addition to the feature of first embodiment of straight injection of electrons in the direction of moving via step channel oxide.
Figure 6B:
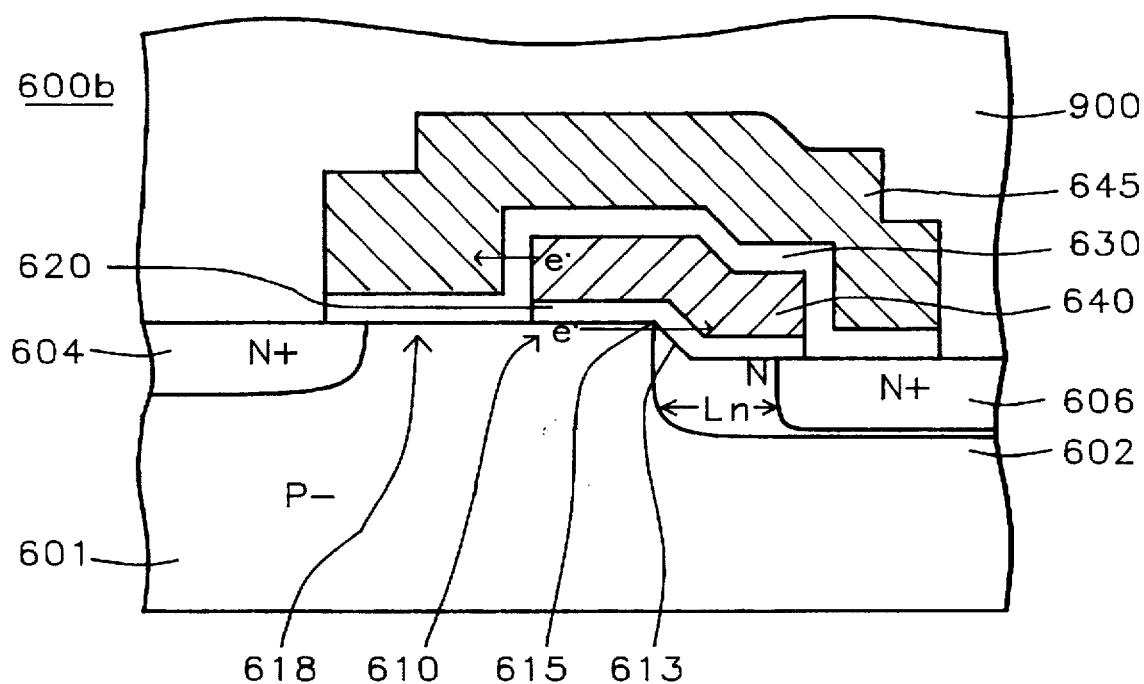
FIG. 6B is a cross section of the split gate EPROM cell with a step channel/large overlapped drain structure designed for another feature of tunnel erase, in accordance with the fourth embodiment of this invention wherein electrons on the floating gate are removed by tunneling from the floating gate to the control gate. Also this transistor is operated as a Nonvolatile RAM by proper designs and conditions which is the fifth embodiment of this invention.
Figure 6C:
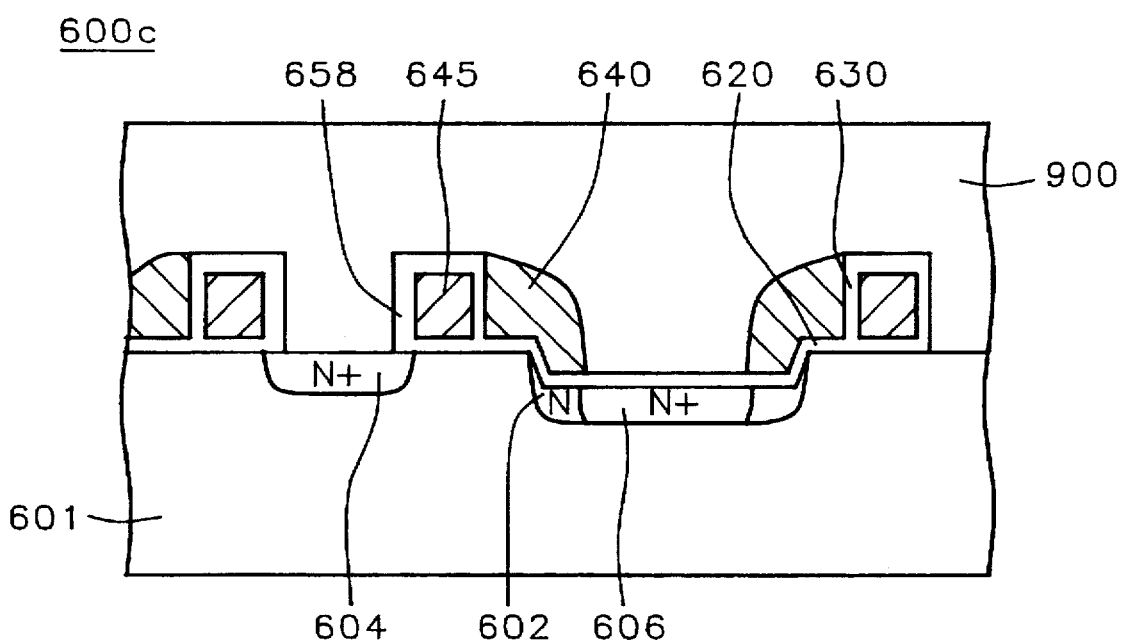
FIG. 6C is a cross section of another split gate EPROM cell structure with a step channel, which is a variation of, and operates with identical functionality to, the transistor 600b in FIG. 6B.
Figure 6D:
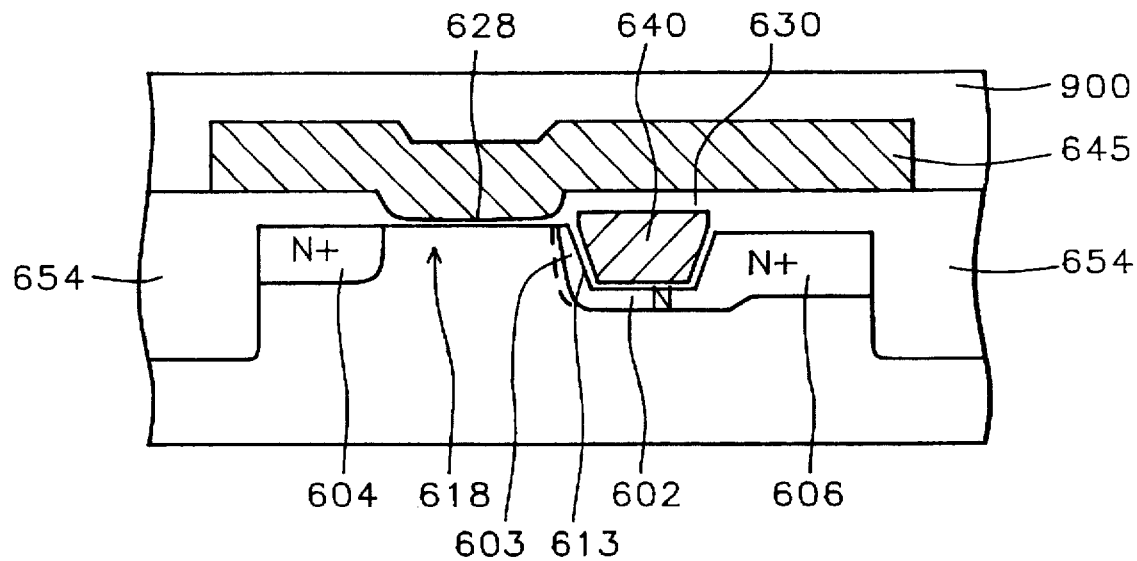
FIGS. 6D and 6E are variations of the double polysilicon split gate transistor of FIG. 6B with the step channel.
Figure 6E:
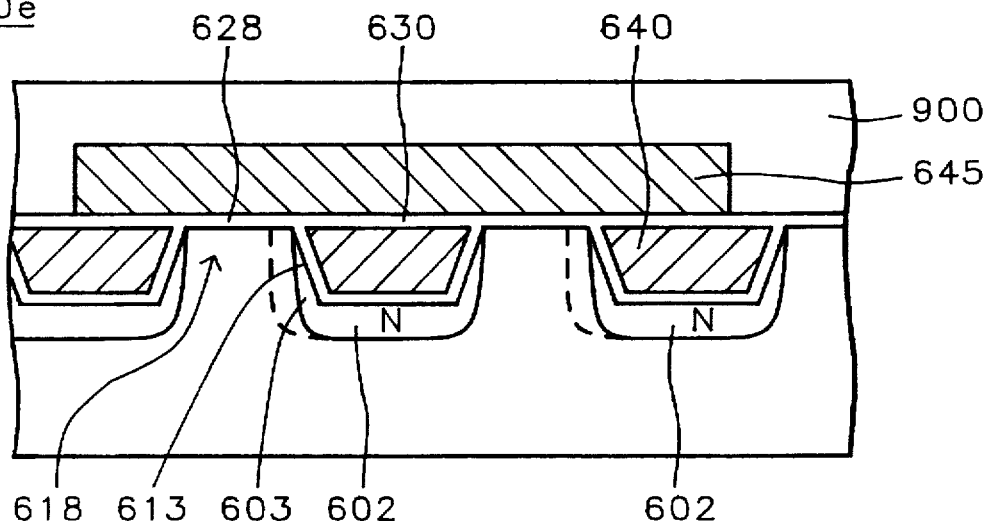

Transistors 600c, 600d, and 600e shown in FIGS. 6C, 6B and 6C are variations of the double poly split gate transistor 600b with the step channel. Programming and erase for all these transistor variations utilize the same electron injection mechanism as previously explained for transistor 600b. The transistor element label numbers in the previous explanation for transistor 600b structure and function, correspond to the same element labels for the transistor variations, 600c, 600d, and 600e.

The floating gate of transistor 600c is formed on the sidewall of the split gate, as shown in FIG. 6C. In 600c, the coupling capacitor is obtained through sidewall, between the split gate and the floating gate. Also erase is performed by tunneling through the sidewall. The floating gate in transistor 600d is recessed into the silicon surface. Transistor 600e has the recessed floating gate of transistor 600d, but the function of N+ drain 606 is combined into the 602 region with a penalty of higher sheet resistance. This transistor 600e can be used to build high density memory arrays, when placed in series.

The advantages obtained in electrically erasable and programmable read-only memory transistors with step channel/drain using poly erase are summarized:

1) The present invention of double polysilicon EPROM cells with step channel/drain enables erase of polysilicon to polysilicon, as well as CHE programming capability using the same control gate, compared to a triple polysilicon EPROM in which the program control gate and erase gate are separate. This split gate transistor achieves the advantages of shallow junctions in a memory cell, due to low voltage operation on drain and source. Also the reduction of polysilicon layers from three layers to two layers reduces process complexity.

2) Since individual control gates (=word lines) can be used for erase operations as well as programming, the word line level of small erase such as byte level, can be obtained instead of the large block size erase in triple polysilicon EPROM. Therefore, a small size of local memory data can be erased instead of an unnecessarily large block, which used to waste the limited program/erase cycles in an EPROM's lifetime. This local erase capability extends the endurance of program/erase cycles.

NONVOLATILE RANDOM ACCESS MEMORY OPERATION IN DOUBLE POLYSILICON SPLIT-GATE STRUCTURE

The prior art for flash EPROM operation, program and erase were implemented sequentially, because the program and erase operating conditions on a terminals were incompatible. The program operation was first carried out over the whole memory chip or a designated portion of the memory chip, then the whole portion was erased to reprogram. EPROM could not write "0"'s and "1"'s at different (bit) transistors for the same connected and selected control gate(word line) at once, therefore EPROM was not called RAM even though it could write "0"'s and "1"'s sequentially. Now, by combining low voltage programming and poly to poly erase features in the double polysilicon split gate transistor with step channel 600b, program and erase are attained at the same time and at different transistor locations for the electrically connected control gate. Thus, the nature of Random Access Memory which was lacking in EPROM, is achieved by proper design and operation of the split gate transistor with step channel.

Using the split gate transistor 600b which is the fourth embodiment, the concept of operation and design as Random Access Memory is the fifth embodiment of this invention.

The principles for the operation of program and erase are same as in the previous section. Electrical erase is achieved by tunneling from the floating gate to the control gate, and programming is achieved by straight injection through to the step channel. In order to keep accuracy in the explanation, repeated descriptions of the transistor and the same model are provided.

In double polysilicon EPROM transistor 600b, requirements for nonvolatile operation are (i) tunnel gate oxide 620 thickness is in the range of 5 to 10 nm, (ii) dielectric 630 such as ONO or nitrided oxide is equal to or thicker than tunnel oxide thickness, which is typically 8 to 15 nm and (iii) the lengths of channel region 610 and the overlap diffusion Ln 602 are roughly same.

Typical critical electric fields for tunnel from polysilicon to polysilicon through ONO which is a thermal oxide over polysilicon or CVD deposited oxide/nitride are reported about 6 MV/cm (lower than when compared to a thermally grown substrate oxide of 10 MV/cm in E. Harare and F. Mazurka). Therefore, the electric field across the dielectric 630 must be more than 6 MV/cm for tunnel erase from floating gate to control gate. On the otherhand, the electric field across the ONO during Channel Hot Electron Injection must be maintained to be less than 3 MV/cm, considering process noise margin and residual charge. In double polysilicon EPROM transistor 600b, operation and design of non-volatile RAM is illustrated using a simple model. A simplified capacitance model of transistor 600b is provided in FIG. 7A. The capacitor Ccg-fg is the capacitance between the control gate 645 and the floating gate 640. Cfg-Ln is the capacitance between floating gate 640 and the underneath n-diffusion region 602. Cfg-ch is the capacitance between floating gate 640 and the channel region 610. Here all three capacitances are chosen to be equal, which makes the explanation easier, but the assumption is provides a practical and reasonable operating point. Depending on the choice of the power supply voltage and process parameters, more precise optimization can be obtained by extending the concept utilizing more detailed modeling.

When a voltage is applied to any terminal node, one third of the voltage is induced onto the floating gate node by capacitive coupling and the induced voltage is superimposed. The program conditions of electron injection onto the floating gate are, as described above, (i) the floating gate voltage >3 V and (ii) the injection point potential at 615>2.5~3.0 V. The dimensions of channel length and Ln can be adjusted to meet the above design requirements.

Figures 7A, 7B:
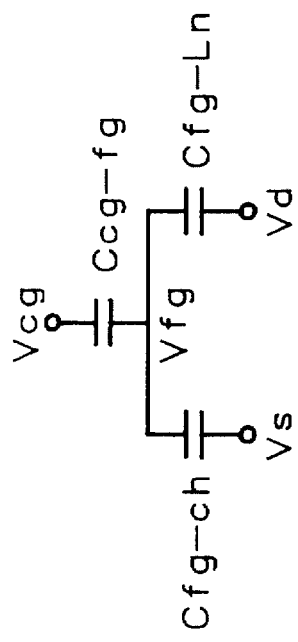
FIG. 7A is a simplified capacitance model for the transistors in FIGS. 6A, 6B, 6C, 6D, 6E to explain the operation of poly tunnel erase EPROM and Non-volatile RAM.
FIG. 7B contains Table which shows example voltage conditions for writing '0' and '1' for Non-volatile RAM operation in accordance with the fifth embodiment of this invention.

For an example in which the tunnel gate oxide is 8 nm, the ONO is 11 nm, and write operating voltage conditions are met, the resulting floating gate potential and the electric field across the ONO are summarized in the Table given in FIG. 7B for write "0", "1" and "no change". Here the lowest voltage used is taken as the zero reference. The control gate voltage is 5 V when unselected and 10 V when selected. The drain and source voltages are Vs=5 V and Vd=10 V for write "0" (higher Vt by electron injection) and Vs=0 and Vd=0 V for write "1" (lower Vt by tunnel erase through ONO) and Vs=5 V and Vd=5 V for unchanged. When 10 V is applied to the control gate and drain node, the floating gate voltage becomes 8.3 V due to capacitive coupling, which satisfies the program conditions. Then the potential across the ONO of 11 nm is 1.7 V=10 V−8.3 V, and the electrical field is 1.55 MV/cm=1.7 V/11 nm). Even in the extreme case in which the control gate is 10 V and the source/drain are 5 V, the floating voltage is 6.7 V, and the electrical field across the ONO is 3 MV/cm=3.3 V/11 nm). So during programming, the electric field across the ONO will be maintained to be less than 3 MV/cm, which meets the target. For the erase operation, the control gate voltage is kept at 10 V, but the source and drain are reduced to 0 V. Then the induced floating gate voltage is 3.3 V due to capacitive coupling, and the voltage across the ONO is 6.7 V=10 V−3.3 V. The electric field across the ONO becomes 6 MV/cm=6.7 V/11 nm), which satisfies the target for electron tunneling from the floating gate polysilicon to the control gate polysilicon, and stored electrons on the floating gate are removed to the control gate. The electric field across the ONO is always kept below 3 MV/cm except during erase, which is safe enough below the critical tunnel field of 6 MV/cm. When the control gate is unselected Vfg=5 V, Vd=10 V, Vs=5 V, the floating gate is raised to 6.7 V due to the coupling from the drain to floating gate capacitance and the floating device may be turned on. This can be protected against by placing a split gate 620 in series.

In accessing the control gate, a "0" or "1" can be written at any time by choosing the appropriate voltages for the drain and source as long as the control gate is selected and raised to 10 V. The operation of writing "0"'s and "1"s in random access memory, namely, program and erase at the same time and at different transistor locations for an electrically connected and selected control gate, is achieved by choosing proper voltages on the drain and source in exactly the same manner that a bit line is selected in Random Access Memory. Thus, non-volatile RAM capability, not achievable in prior art EPROM, is enabled in the present invention transistor for a split gate double polysilicon transistor.

The advantages obtained for operation with the double polysilicon split gate transistor with step channel/drain are summarized:

1) Individual bit by bit program and erase can be preformed by need basis, when data is required to be altered, instead of the large block size erase in prior art triple polysilicon EPROM which wastes the limited program/erase cycles in an EPROM lifetime. This bit by bit write capability extends the endurance of program/erase cycles.

2) The present invention of the double polysilicon split cell with step channel/drain and proper operation and design provides non-volatile RAM behavior. This present invention will find much wider applications since it behaves like RAM but is also non-volatile.

TRIPLE POLYSILICON EPROM WITH VERTICAL FLOATING GATE CHANNEL

Figure 8A:
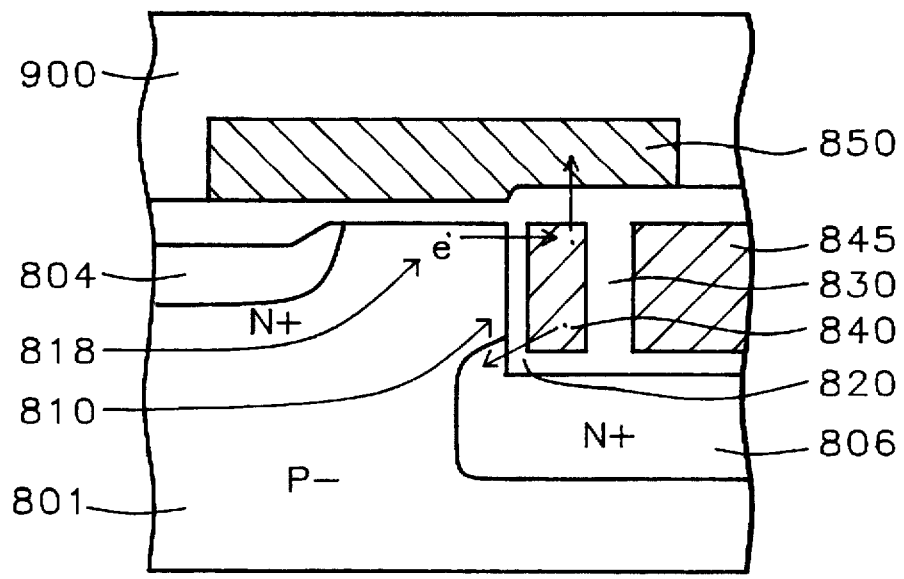
FIG. 8A is a cross section of the triple polysilicon split gate EPROM cell with a vertical (step) long channel for floating gate, in accordance with the sixth embodiment of this invention wherein channel hot electrons are injected straight in the direction of the moving electrons from source, into the floating gate through the vertical channel oxide. Electrons on the floating gate are removed by tunneling from the floating gate to the drain diffusion or from the floating gate to the select gate.
Figure 8B:
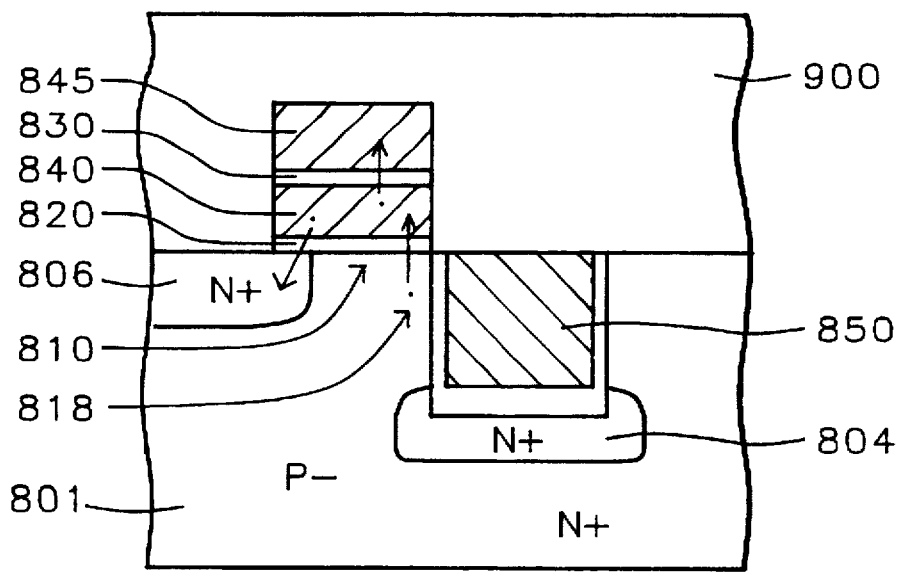
FIG. 8B is a cross section of the triple polysilicon split gate EPROM cell with a vertical channel for normal gate, which is a variation of transistor FIG. 8A, in accordance with the sixth embodiment of this invention wherein channel hot electrons are injected straight in the direction of the moving electrons from source, into the floating gate through the horizontal channel oxide. Electrons on the floating gate are removed by tunneling from the floating gate to the drain diffusion.

Another feature of this invention is the variation of EPROM transistors 800a and 800b with step injection channel in accordance with the sixth embodiment. FIG. 8A and FIG. 8B presents a cross-sectional view of a triple polysilicon EPROM transistor with an arbitrary vertical floating gate channel in series to horizontal channel. Transistors 800a and 800b consist of p-type silicon substrate 801, N+ source diffusion 804, a channel region of horizontal 818 whose conductivity is controlled by a third polysilicon for the select gate (word line). The vertical channel 810 is controlled by floating gate 840 and control gate 845. The floating gate 840 covers only the vertical channel and a drain diffusion 806 at bottom of the vertical trench. The floating gate is dielectrically isolated from thermally grown silicon dioxide 820. Control gate 845 is capacitively coupled to floating gate 840 through dielectric film 830, which can be either thermally grown silicon dioxide or a combination of thin layers of silicon dioxide and silicon nitride. P-type 801 is typically doped in the range of 1E16cm-3 to 5E17cm-3, vertical gate dielectric film 820 is typically 5 to 10 nanometers thick, the horizontal channel gate oxide is slightly thicker at 8 to 15 nm, and floating gate 840 is usually a heavily N+ doped film of polysilicon with a thickness that can be as low as 100 nm or as high as 300 nm. Control gate 845 is a heavily N+ doped film of polysilicon. The select gate 850 is polysilicon or a low resistivity interconnect material like silicide, or a refractory material. N+ source diffusion 804 and is formed by ion implantation of Arsenic, Phosphorus, or Antimony. N+ drain 806 is formed by the same ion implant material, but self-aligned to the vertical channel edge 810, immediately after formation of the step, and prior to deposition of floating gate polysilicon 840. When N+ junction 806 is used for erase, the junction 806 is doped with phosphorus as well as Arsenic to increase junction depth for higher junction breakdown. When erase is performed by tunneling between floating gate 840 and select gate 850, the drain junction depth can be a normal Arsenic-doped junction. Here the channel electrons are supplied from N+ junction 804, but the electrons can be inverted layers of channel electrons instead of N+ junction as long as it supplies electrons into the select gate channel.

When a certain voltage level is applied to control gate 845, the floating gate potential which is capacitively coupled to the control gate becomes higher than the threshold voltage in the vertical channel region 810, and electrons start flowing from source junction 804 to drain junction 806, if select gate 850 is also raised higher than the threshold voltage. The electrons are then accelerated by the horizontal field, as in a MOSFET transistor.

When control gate 845 is biased high enough to raise the floating gate potential higher than the sum of the drain and threshold voltages, the channel potential at 815 approaches the voltage applied to drain 806, as long as select gate 850 is biased slightly higher than the threshold voltage and the horizontal channel resistance is high compared to the vertical channel resistance. Then, maximum electric field is created at the intersection 815 of the horizontal and vertical channel, which becomes the injection point because electrons reach maximum speed and the momentum of the electrons is still horizontal. When the energy level of electrons gained in channel transport is higher than the barrier height, high energy electrons penetrate straight into the floating gate. In contrast, prior art relied on the indirect process of electron scattering by phonon and 90 degree redirection upward to the floating gate. Thus the configuration of this vertical channel structure enhances the efficiency of electron injection from the channel to the floating gate by many orders of magnitude.

FABRICATION METHOD OF EPROM/NVRAM TTRANSISTOR WITH STEP STEP CHANNEL/ DRAIN

The prime objective of this invention is to introduce a new configuration for the EPROM device structure, and device operations for EPROM, EPROM and NVRAM transistors with the new structure. Another objective is to demonstrate methods to fabricate the structure. A few approaches from among many possible methods to fabricate the step channel at drain edge, are described. The first approach is a simple non-self aligned method to cover the channel step with a floating gate polysilicon. The second approach is to minimize the misalignment during the masking process in the first non-self-alignment approach.

Figure 9A:
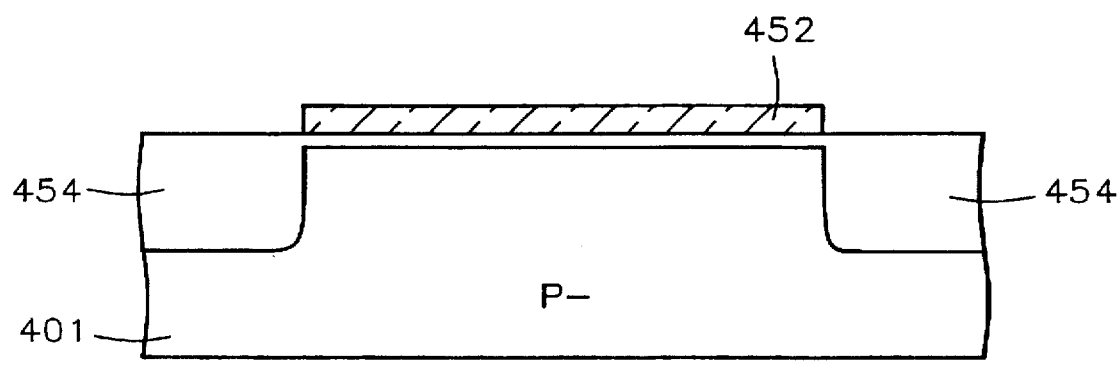
FIGS. 9A and 9B are cross-sections of the forming step channel with a self aligned drain n-diffusion during key stages in manufacturing process example in accordance with the seventh embodiment of this invention.
Figure 9B:
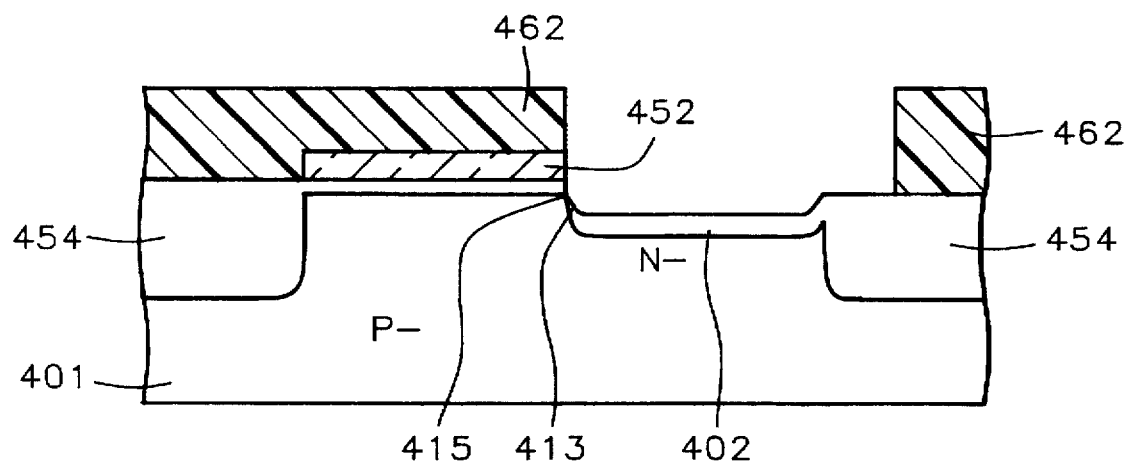

FIG. 9A and FIG. 9B show the fabrication method for the step channel/drain structure in accordance with seventh embodiment of this invention. Step formation starts immediately after device isolation of LOCOS or shallow trench isolation 454, as shown in FIG. 8A. The device area is still covered with a dielectric 452 of thin silicon oxide and CVD deposited nitride. Photoresist 462 in FIG. 8B is applied and defined for the step region. Using photoresist layer 462 as a mask, the dielectric layer 452 is etched by dry RIE or wet etch like KOH. Then the silicon substrate is carefully etched at least 30 nm. The angle of the step, measured from the horizontal silicon surface, should be maintained to be greater than 30 degrees in order to achieve high injection efficiency, by injecting electrons directly with horizontal momentum into the floating gate. The angle can be controlled by setting the etching conditions in RIE. Then n-region 402 is implanted by self alignment to drain edge 415 with a species of Arsenic, Phosphorus or Antimony. The implant dosage for the n-region is less than 5E19 cm-3, in order to maintain good gate oxide quality and to control channel oxide thickness over step 413. A structure of an n-junction self-aligned to the step channel/drain region is achieved with this simple process. After removing photoresist 462 and dielectric layer 452, the tunnel oxide 420 is thermally grown. After this formation of step channel/drain, the normal EPROM process follows.

Figure 9C:
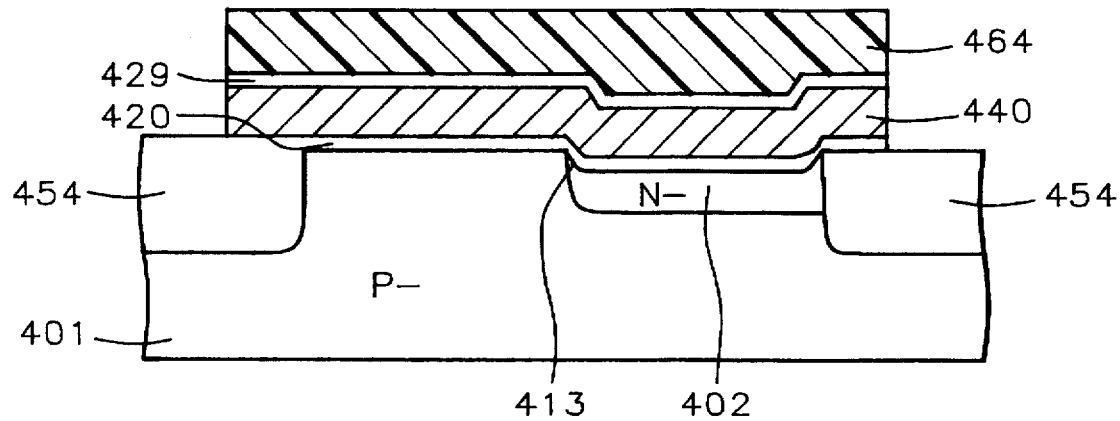
FIGS. 9C and 9D are cross-sections of the forming stack gate cell of FIG. 4A, FIG. 5A and FIG. 6A during various stages of the manufacturing process.
Figure 9D:
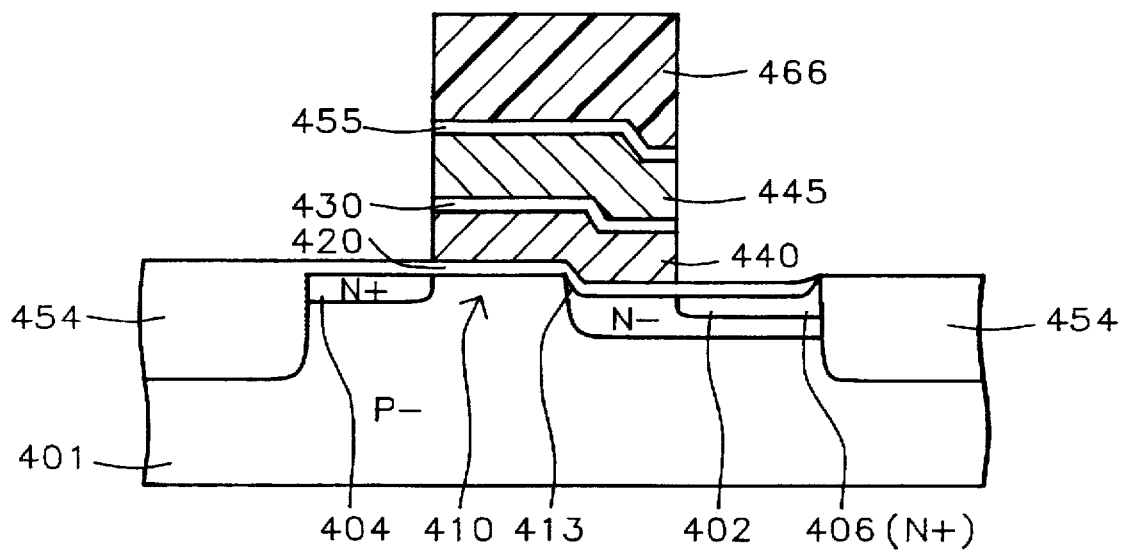

The methods to fabricate transistor 400a in FIG. 4A and transistor 600a in FIG. 6A are provided next. The difference between the two transistors is simply in the N-drain junction. The N-drain in transistor 400a is designed for a high voltage during tunnel erase from the floating gate to its N-drain. Therefore the N-drain junction in transistor 400a is deeper than that of 600a, obtained by the implant of high diffusitivity, Phosphorus with the dosage range of 5E13/cm$^3$~5E14/cm$^3$ and at the energy range of 100 keV~180 keV. On the otherhand, the N-drain in transistor 600a is formed with a reduced energy in the range of 30 keV~100 keV for Phosphorus ion implant. Arsenic can also be used for the N-drain in transistor 600a. Thus the N-drain junction depth for transistor 600a is as shallow as the Arsenic source junction. Floating gate polysilicon 440 is deposited over the thermally grown tunnel oxide 420 and thin oxide is grown over the polysilicon layer. Then, photoresist mask 464 for floating gate separation from the adjacent cell (in the vertical dimension) is applied, shown in FIG. 9C, as floating gate definition over isolation oxide 454. A composite dielectric layer 430 such as ONO or nitrided oxide is deposited and followed by second control gate polysilicon 445. After formation of dielectric layer 454 over control gate polysilicon, photoresist mask 466 in FIG. 9D defines the control gate and floating gate by careful reactive ion etching followed by ion implantation of the source/drain junction region. Normal FET processes follow such as sidewall spacer formation, diffusion annealing, passivation, contact hole opening, and metalization for wiring. Thus, the final device structures for stack transistors 400a in FIG. 4A and transistor 600a in FIG. 6A are obtained.

Figure 10A:
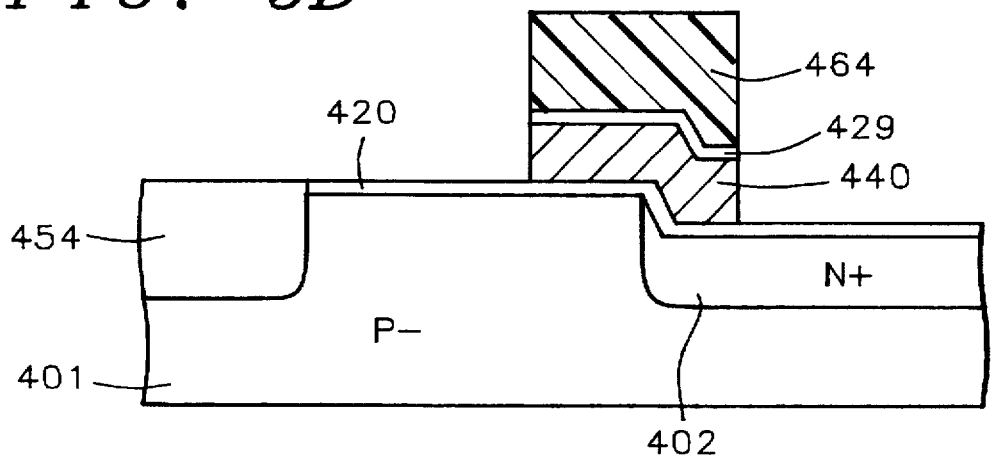
FIG. 10A through 10C are cross-sections of the forming split gate cell of FIG. 4B, and FIG. 6B during various stages of the manufacturing process.
Figure 10B:
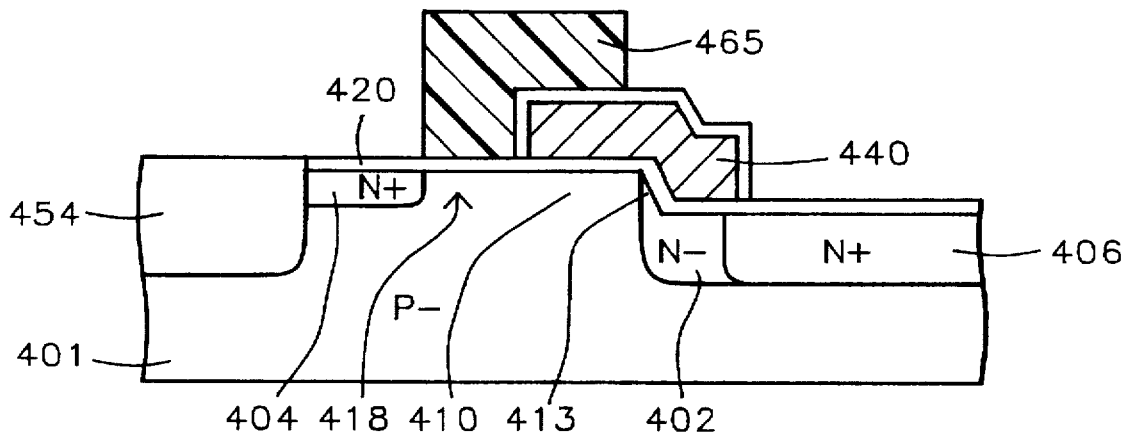
Figure 10C:
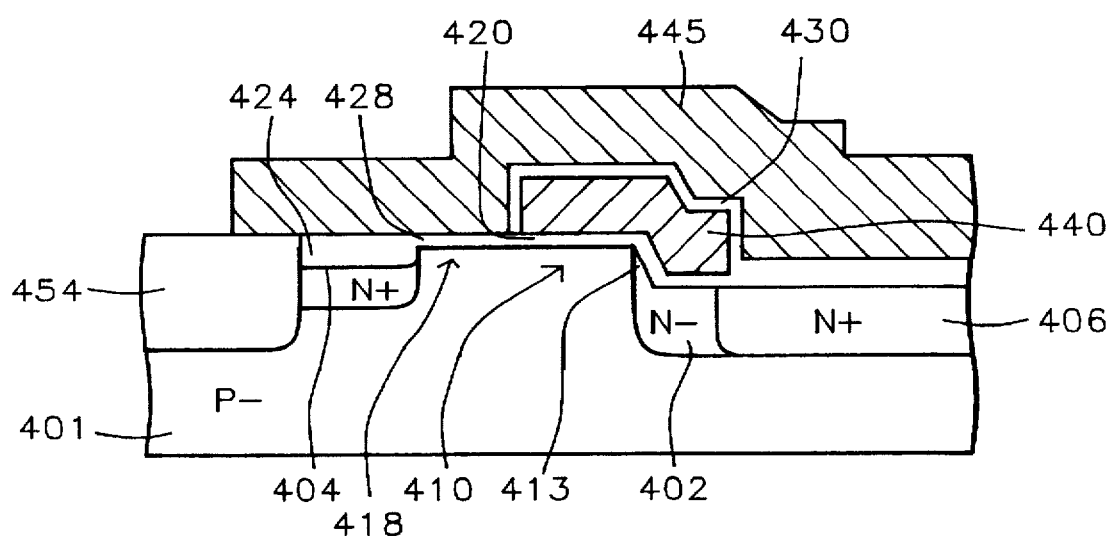

In order to fabricate split gate transistors 400b and 600b with the step channel/drain, there is no difference the fabrication of the two transistors from commonly practiced split gate processes, after formation of the step channel. During the step channel formation, N-drain junction requirements are different between the transistors. The N-drain in transistor 400b is designed for a high voltage during tunnel erase from the floating gate to its N-drain. Therefore the N-drain junction in transistor 400b is deeper than that of 600b, obtained by the implant of high diffusitivity, Phosphorus with the dosage range of 5E13/cm$^3$~5E14/cm$^3$ and at the energy range of 100 keV~180 keV. On the otherhand, the N-drain in transistor 600b is formed with a reduced energy in the range of 30 keV~100 keV for Phosphorus ion implant. Arsenic can also be used for the N-drain in transistor 600b. Thus the N-drain junction depth for transistor 600b is as shallow as the Arsenic source junction. The floating gate is defined first as shown in FIG. 10A 464, instead of separating between adjacent cells in stack gate transistor in FIG. 9C (shown as floating gate definition over field oxide). Photoresist mask 465 in FIG. 10B to form the N+ junction is inserted prior to the second polysilicon definition, followed by ion implantation with the species of Arsenic, Phosphorus or Antimony. After removing the thin oxide over channel 418 and floating gate polysilicon, split gate channel gate oxide and poly oxide are thermally grown. Then, a composite dielectric layer such as ONO or nitrided oxide followed by second control gate polysilicon 445 in FIG. 10C are deposited. The dosage of N+ for 404 is chosen to be relatively high, in the range of 5E20 to 5E21 cm-3, to grow oxide 424 thicker over N= diffusion 404, compared to gate oxide 428 over the split channel 418 in FIG. 10C. After formation of dielectric composite layers over the control gate polysilicon 430 and split channel region 428, photoresist mask defines at the same time the control gate and floating gate, separating adjacent cells over the field oxide by careful reactive ion etch. Sidewall spacer formation and diffusion annealing, passivation, contact hole opening and metalization for wiring in the normal FET process, follows. Thus the final device structures for split gate transistor 400b in FIG. 4A and transistor 600b in FIG. 6A are obtained.

With their respective methods, structures of step channel with a self-aligned diffusion of high injection area can be achieved by simple processes for transistors 400a, 400b, 600a and 600b. Once the step channel/drain is formed, existing fabrication processes for the stack gate transistor and split gate transistor follow.

Figure 11A:
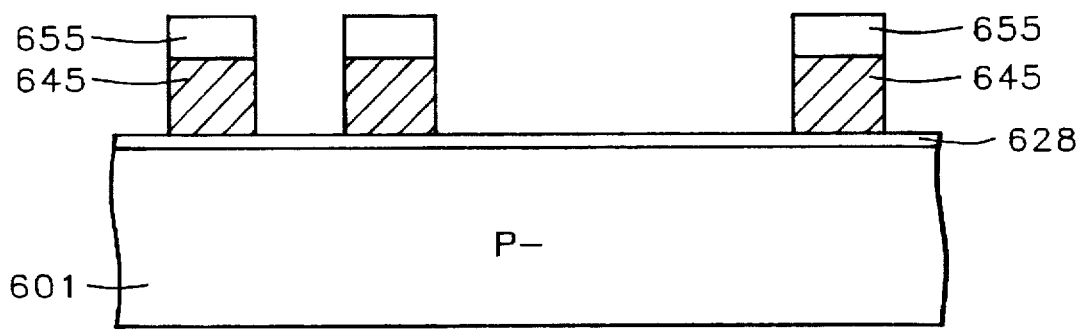
FIG. 11A through 11G are cross-sections during the formation of the split gate of FIG. 6C, during various stages in the manufacturing process, in which the horizontal floating channel is at least 150 nm.
Figure 11B:
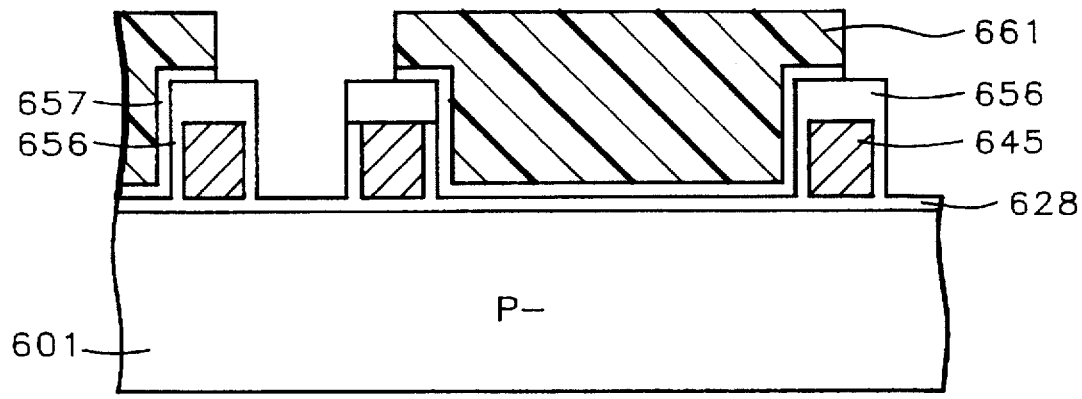
Figure 11C:
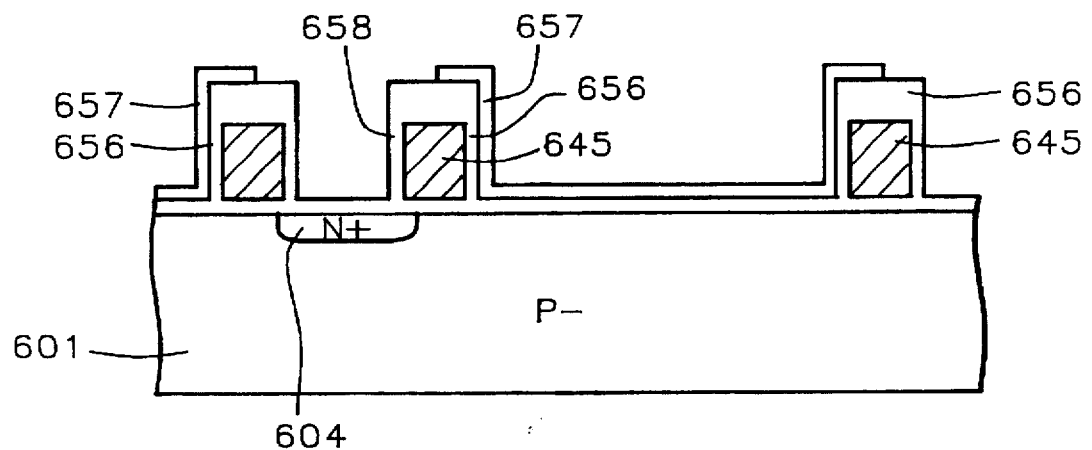
Figure 11D:
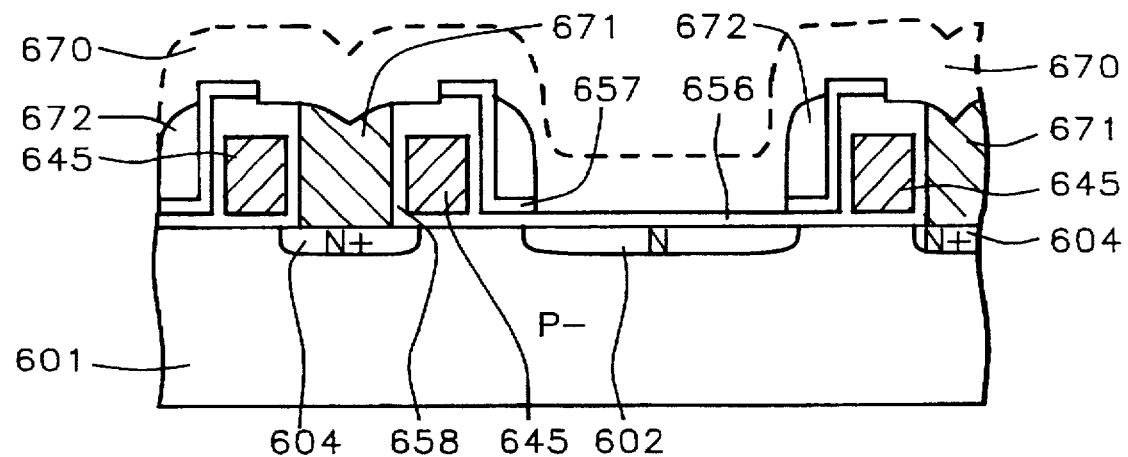
Figure 11E:
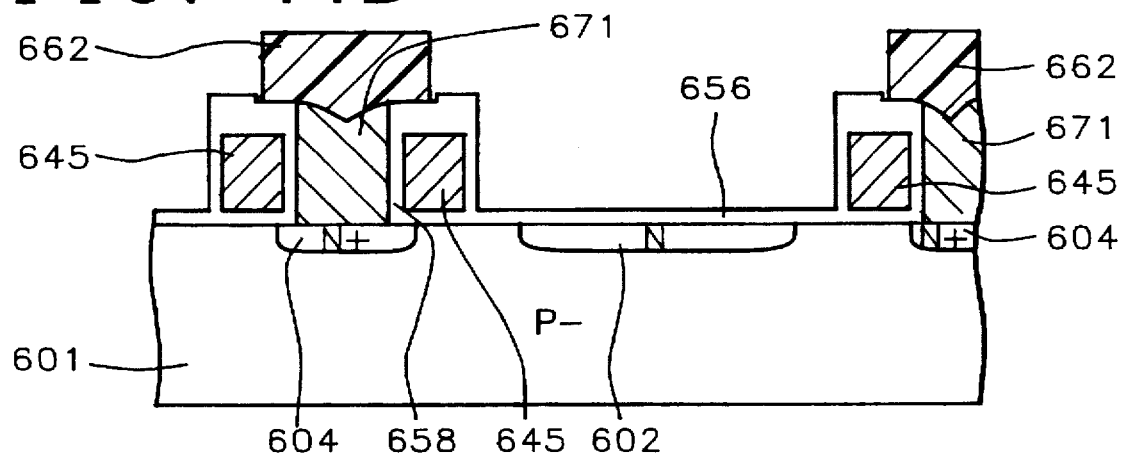
Figure 11F:
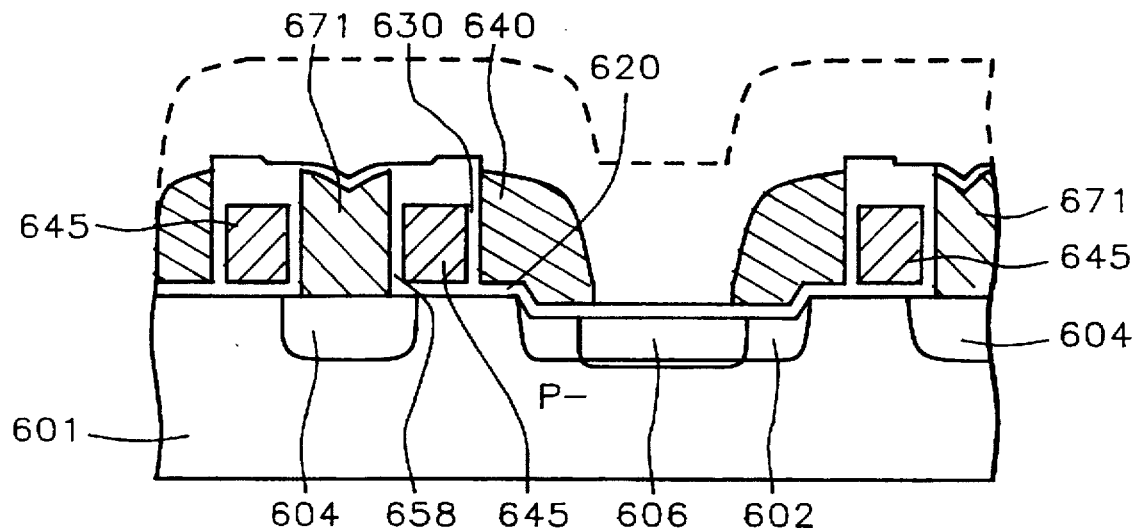
Figure 11G:
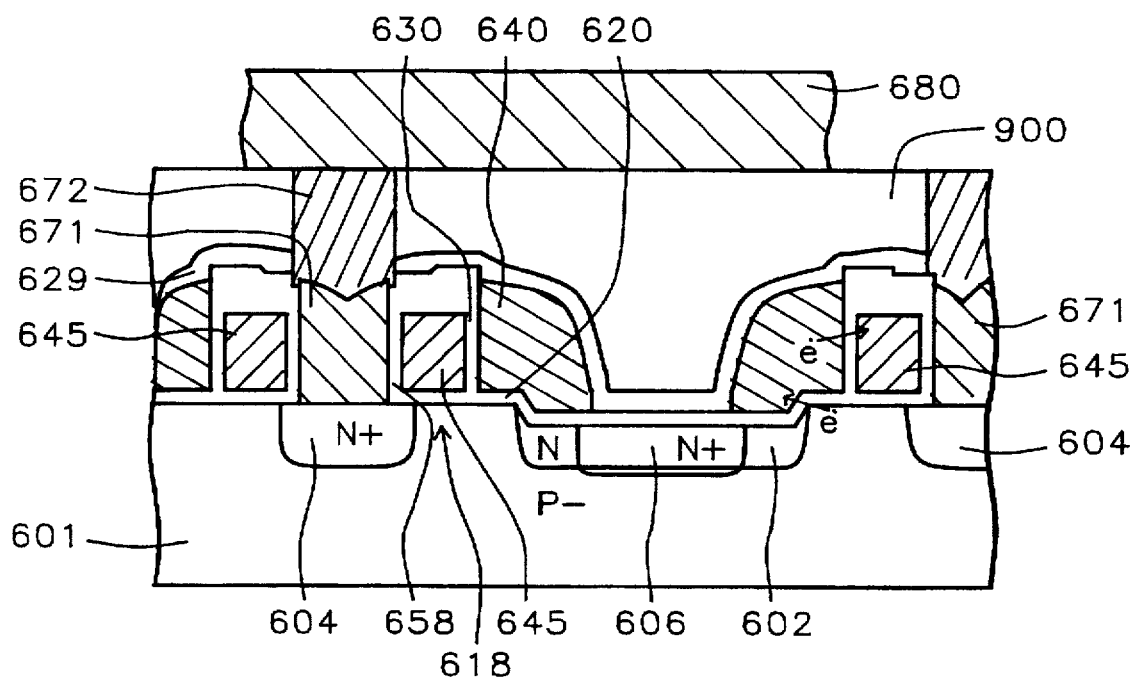
Figure 11H:
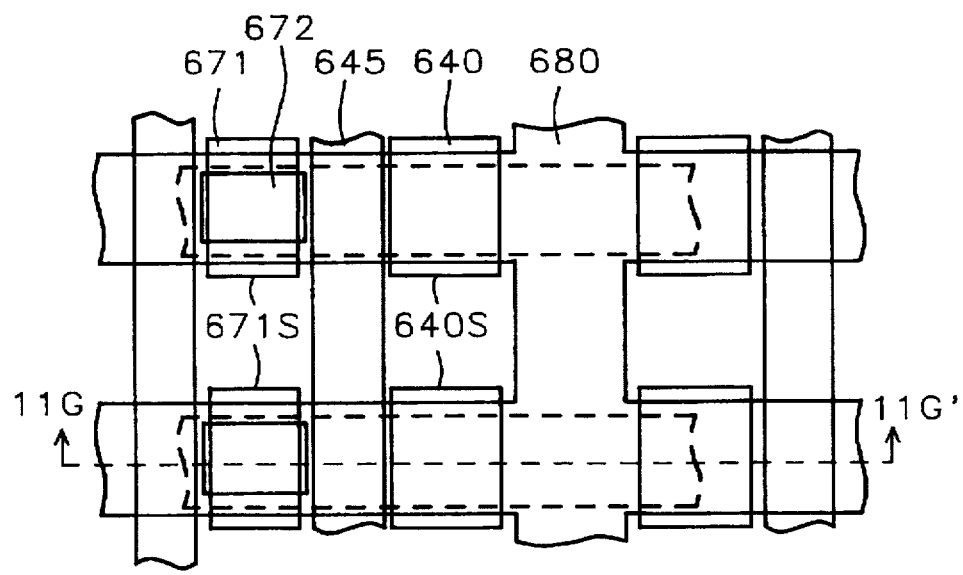
FIG. 11H is a top view of the split gate with the step injection channel.

The second approach is a fabrication method for the split gate transistor 600c with precisely controlled lengths of horizontal channel and overlapped LNG under the floating gate. Two fabrication methods are described: the first, for a relatively large horizontal channel under the floating gate and the next for a minimal length of the horizontal channel length. FIG. 11A through FIG. 11G shows a fabrication method of a variation of a split gate transistor 600c with a step channel/drain structure in accordance with the above embodiment of this invention. After device isolation of LOCOS or shallow trench isolation, word line gate 645 (equivalent in function to the split gate channel 618 in transistor 600b) is defined as shown in FIG. 11A where the height of the polysilicon 645 is about 250 nm to 400 nm and the polysilicon is covered with a dielectric layer 655 of 100 to 200 nm. Then a thin oxide (10–20 nm) 656 is thermally grown over poly sidewall and followed by thin nitride 657 deposition by Chemical Vapor Deposition in FIG. 11B. Photoresist 661 is applied to define contact area. Using the photoresist mask, the nitride film 657 is isotropically etched by RIE and ion species of Arsenic is implanted to form the N+ source junction. After removing the photoresist, the side wall oxide (50–80 nm) 658 in FIG. 11C is thermally grown selectively in the contact hole area which is several times thicker than that for 656 of the other side of polysilicon gate 645. The bottom oxide of contact hole is vertically etched by RIE, during which, the nitride 656 prevents oxidation of the area underneath and also acts as an etch stop during etching of the oxide over junction N+ 604. Polysilicon 670 with a thickness of 180–200 nm is deposited as shown by dotted line in FIG. 11D. Directional dry etch is performed to form sidewall spacer 672, which determines horizontal channel length 610 under the floating gate. When the 0.3 urn lithography is used, the gate width and space 645 is 0.3 um, so the contact opening after thick side wall oxidation 658 is about 0.25 um. Therefore, the contact hole 671 is still completely filled with this polysilicon even after poly sidewall etching when the polysilicon 670 is thicker than 150 nm. The filled polysilicon is used to form the self aligned contact. After defining the polysilicon spacer, Phosphorus for N-drain 602 is implanted with a dosage in the range of 1E14–7E15 per cm² at 50–100 keV. Then the thin nitride layer 657 is etched directionally using poly spacer 672 as a etching mask. The cross sectional view at this point looks like the figure in FIG. 11D. The combination of creating the horizontal channel, filling the contact hole and providing self aligned borderline contacts by one polysilicon deposition is one of unique features in this process. Photoresist 662 is provided to protect polysilicon in the contact hole during removal of the sidewall polysilicon, which was used to define the step and self aligned N-drain region 602 in FIG. 11E. Thin nitride 657 is used to define thermal oxide underlayer 656. Then nitride 657 is removed selectively and isotropically by Chemical Dry Etch. Vertical dry etching of the silicon substrate is continued to create about a 50 nm step. At this point, the cross-section is as viewed in FIG. 10E. After removing photoresist 662, the oxide 656 is wet etched in a diluted buffer of HF solution. Thermal oxide (50–100 nm) is grown over the channel region 620 and the sidewall of polysilicon 630 (sidewall oxide over poly is slightly thicker than that over single crystal silicon substrate) in FIG. 11F. The oxide layer is nitrided in a N₂O environment and another oxidation is repeated to minimize the pin hole. Instead of nitridation, a thin CVD nitride layer (about 6 nm) can be deposited. Then floating gate polysilicon is deposited conformally by CVD and vertically etched by RIE as shown in FIG. 10F. The thickness of the polysilicon dictates the sidewall dimension, which defines the floating gate length. Since the CVD thickness is controlled very tightly (within 5%), the dimensions of horizontal channel length and Ln length are very accurately defined, to meet the precise design goals, by these two sidewall process. The objective of nitridation and presence of the nitride layer over poly side wall oxide 630 is to reduce leakage current between word gate 645 and floating gate 640, in order to improve retention time. The silicon nitride can be also be replaced by a silicon rich silicon oxide to reduce the tunnel erase voltage. After sidewall poly etch, the floating gate and the contact poly between adjacent cells are separated at the same time by using a photoresist mask (like the slit mask in a conventional floating gate EPROM process) and by careful reactive ion etch marked as 640S and 671S in FIG. 11H. Then thermal oxidation of poly silicon floating gate and deposition of CVD oxide and nitride composite layer 629 follows. The purpose of composite layer 629 is to protect the floating gate polysilicon 640 from contamination and moisture. Normal process follows: deposition of a passivation layer such as jphosphosilicate glass (PSG), planarization by Chemical Mechanical Polish, opening of the contact hole, filling of the contact hole by W or Al or Cu, and metalization for wiring. The cross sectional view after processing is shown in FIG. 11G. The bird's eye or top view of the memory cell is shown in FIG. 11H. A structure of self aligned n-junction to step channel/drain region is achieved with this simple process.

Thus the channel length, horizontal channel and step N-drain lengths under the floating gate of the split gate can be precisely defined by sidewall techniques. Also the polysilicon used to define the horizontal channel under the floating gate is also utilized to fill the self aligned contact hole.

Figure 12A:
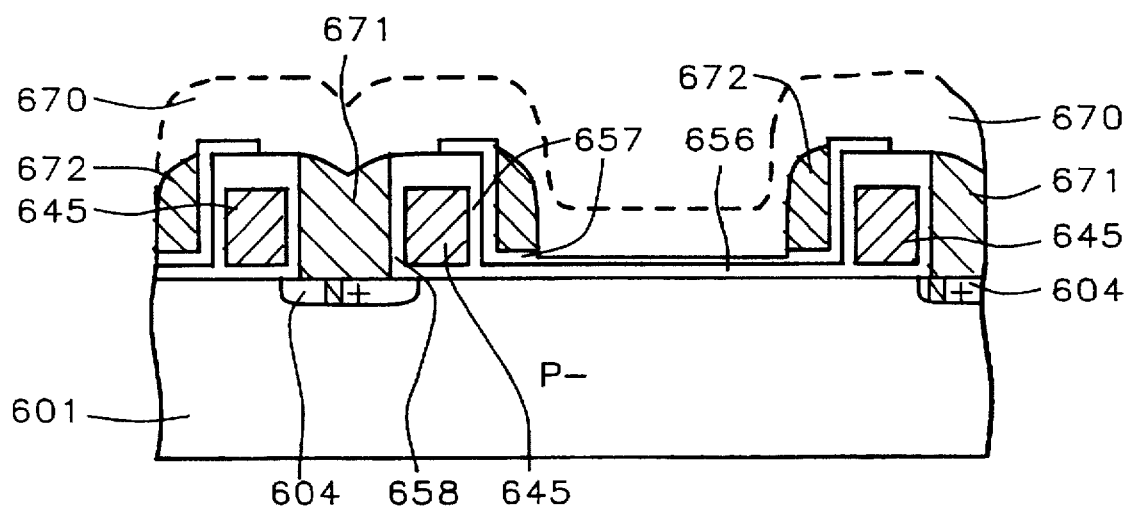
FIGS. 12A through 12C are cross-sections during the formation of the split gate of FIG. 6C, during various stages in the manufacturing process, in which the horizontal floating channel is less than 100 nm.
Figure 12B:
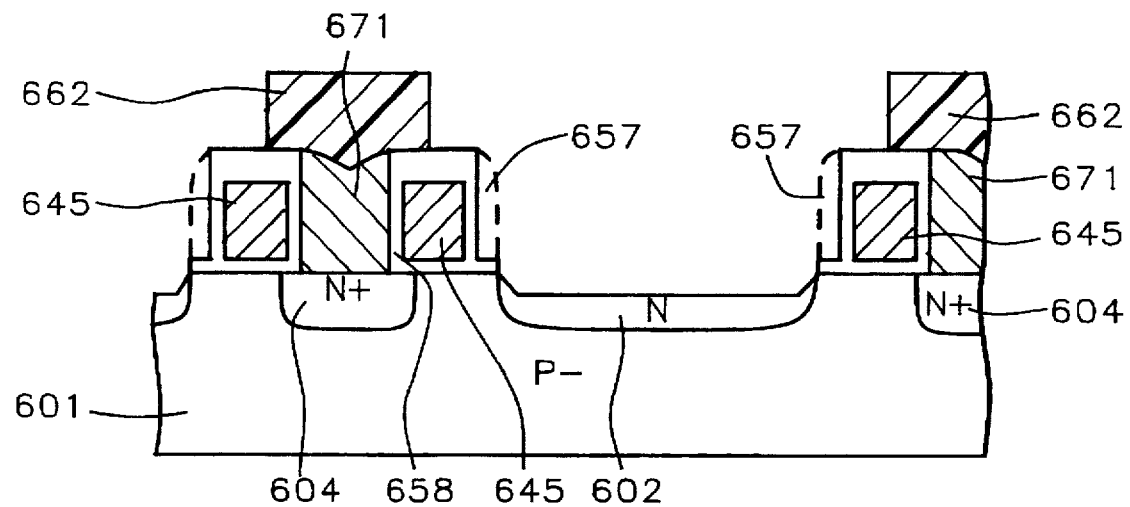
Figure 12C:
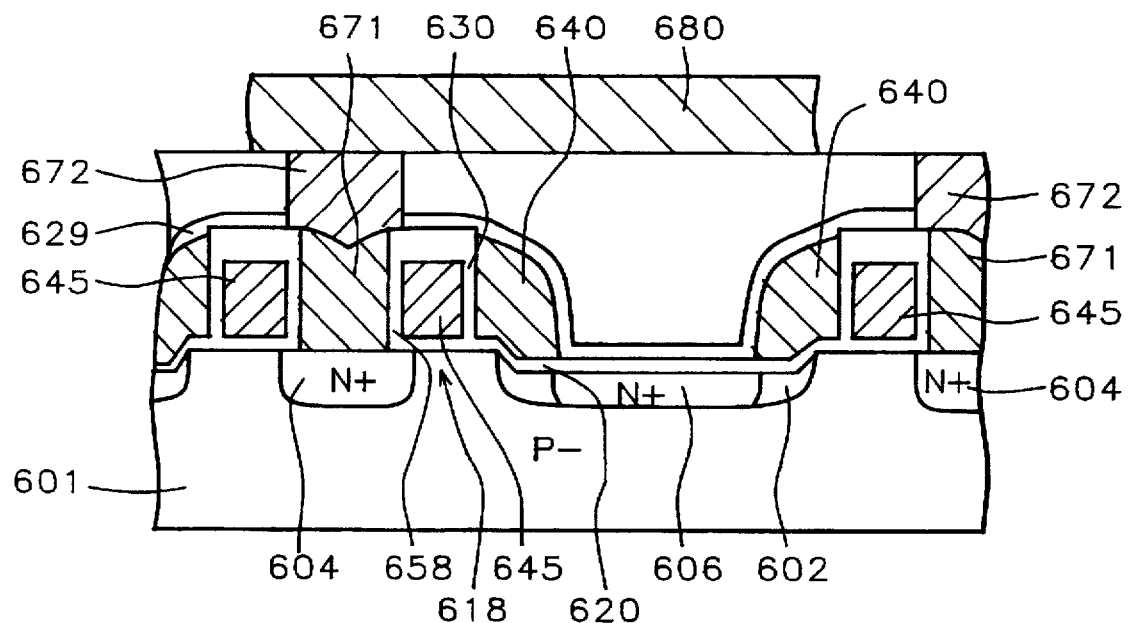

FIGS. 12A through FIG. 12C show a fabrication method of a variation of the split gate transistor 600c with a step channel/drain structure, wherein the horizontal channel length under the floating gate is very small, typically less than 100 nm compared to the previously large horizontal channel length (larger than 150 nm). The processes of these two transistors is very similar.

After device isolation of LOCOS or shallow trench isolation, word line gate 645 (equivalent in function to the split gate channel 618 in transistor 600b) is defined as shown in FIG. 11A where the height of the polysilicon 645 is about 250 nm to 400 nm and the polysilicon is covered with a dielectric layer 655 of 100 to 200 nm. Then a thin oxide (10–20 nm) 656 is thermally grown over polysilicon sidewall and followed by thin silicon nitride 657 deposition by Chemical Vapor Deposition in FIG. 11B. Here, the nitride thickness determines the horizontal channel length (less than 100 nm). Photoresist 661 is applied to define contact area. Using the photoresist mask, the nitride film 657 is isotropically etched by RIE and ion species of Arsenic is implanted to form the N+ source junction. After removing the photoresist, the side wall oxide (50–80 nm) 658 in FIG. 11C is thermally grown selectively in the contact hole area which is several times thicker than that for 656 of the other side of polysilicon gate 645. The bottom oxide of contact hole is vertically etched by RIE, during which, the nitride 656 prevents oxidation of the area underneath and also acts as an etch stop during etching of the oxide overjunction N+ 604. Polysilicon 670 with a thickness of 180–200 nm is deposited as shown by dotted line in FIG. 11D. Directional dry etch is performed to form sidewall spacer 672. When the 0.3 um lithography is used, the gate width and space 645 is 0.3 um, so the contact opening after thick side wall oxidation 658 is about 0.25 um. Therefore the contact hole 671 is still completely filled with this polysilicon even after poly sidewall etching when the polysilicon 670 is thicker than 150 nm. The filled polysilicon is used to form the self aligned contact. Photoresist 662 is provided to protect polysilicon in the contact hole during removal of the sidewall polysilicon. Then the nitride 657 is vertically etched and the nitride spacer shown by the dotted line in FIG. 12B is used to define the thermal oxide under layer 656. Then nitride 657 is removed selectively and isotropically by Chemical Dry Etch. After defining the step, Phosphorus for N-drain 602 is implanted with a dosage in the range of 1E14–7E15 per Cm² at 50–100 keV. Vertical dry etching of the silicon substrate is continued to create about a 50 nm step. At this point, the cross-section is as viewed in FIG. 12B. After removing photoresist 662, the oxide 656 is wet etched in a diluted buffered HF solution. Thermal oxide (50–100 nm) is grown over the channel region 620 and the sidewall of polysilicon 630 (sidewall oxide over poly is slightly thicker than that over single crystal silicon substrate). The oxide layer is nitrided in a N₂O environment and another oxidation is repeated to minimize the pin hole. Instead of nitridation, a thin CVD silicon nitride layer (about 6 nm) can be deposited. Then floating gate polysilicon is deposited conformally by CVD and vertically etched by RIE as shown in FIG. 12C. The thickness of the polysilicon dictates the sidewall dimension, which defines the floating gate length. Since the CVD thickness is controlled very tightly (within 5%), the small dimensions of horizontal channel length and Ln length are very accurately defined, to meet the precise design goals, by these two sidewall process of nitride and polysilicon. The objective of nitridation and presence of the nitride layer over poly side wall oxide 630 is to reduce leakage current between word gate 645 and floating gate 640, in order to improve retention time. The nitride can be also be replaced by a silicon rich oxide to reduce the tunnel erase voltage. After sidewall poly etch, the floating gate and the contact poly between adjacent cells are separated at the same time by using a photoresist mask (like the slit mask in a conventional floating gate EPROM process) and by careful reactive ion etch marked as 640S and 671S in FIG. 11H. Then thermal oxidation of poly silicon floating gate and deposition of CVD oxide and nitride composite layer 629 follows. The purpose of composite layer 629 is to protect the floating gate polysilicon 640 from contamination and moisture.

The normal process follows: deposition of a passivation layer such as PSG, planarization by Chemical Mechanical Polish, opening of the contact hole, filling of the contact hole by W or Al or Cu, and metalization for wiring. The bird's eye or top view of the memory cell is exactly the same as shown in FIG. 10H. A structure of self aligned n-junction to step channel/drain region is achieved.

Thus the channel length, horizontal channel and step N-drain lengths under the floating gate of the split gate can be precisely defined by two sidewall techniques. Self aligned contacts filled with polysilicon are also provided.

Figure 13A:
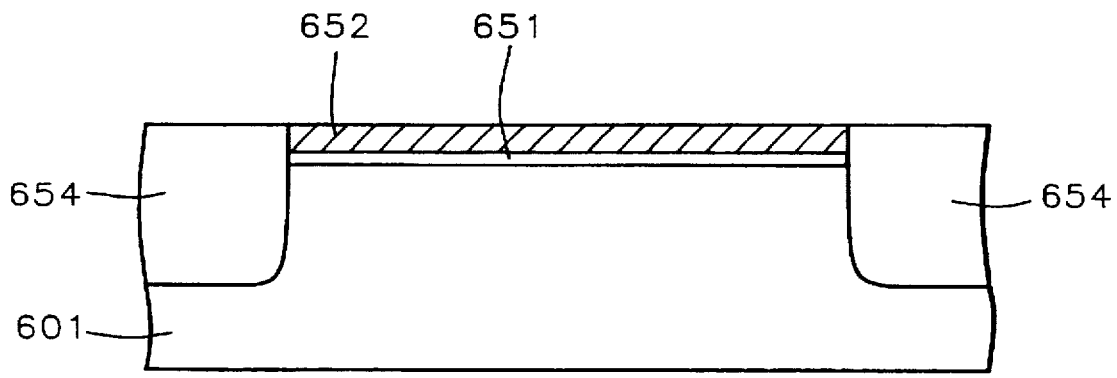
FIGS. 13A through 13G are cross-sections of transistor 600d and transistor 600e, during various stages of the manufacturing process.
Figure 13B:
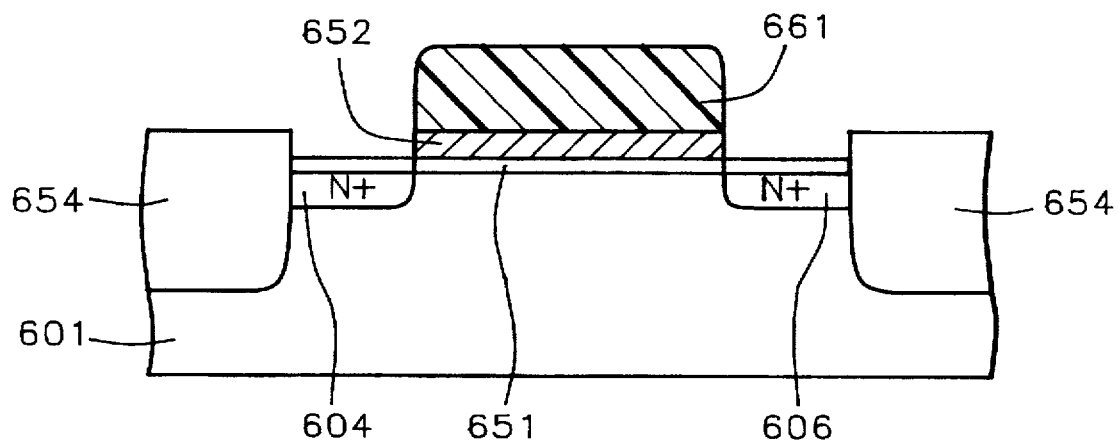
Figure 13C:
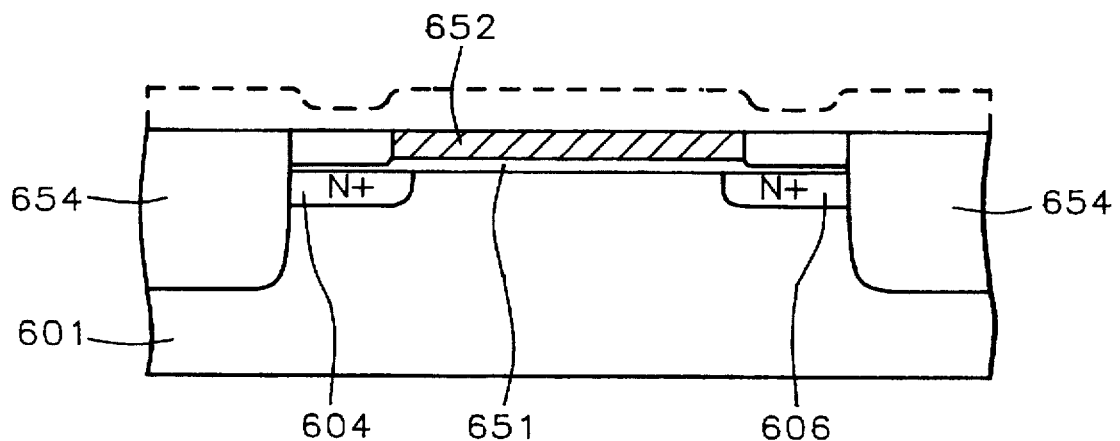
Figure 13D:
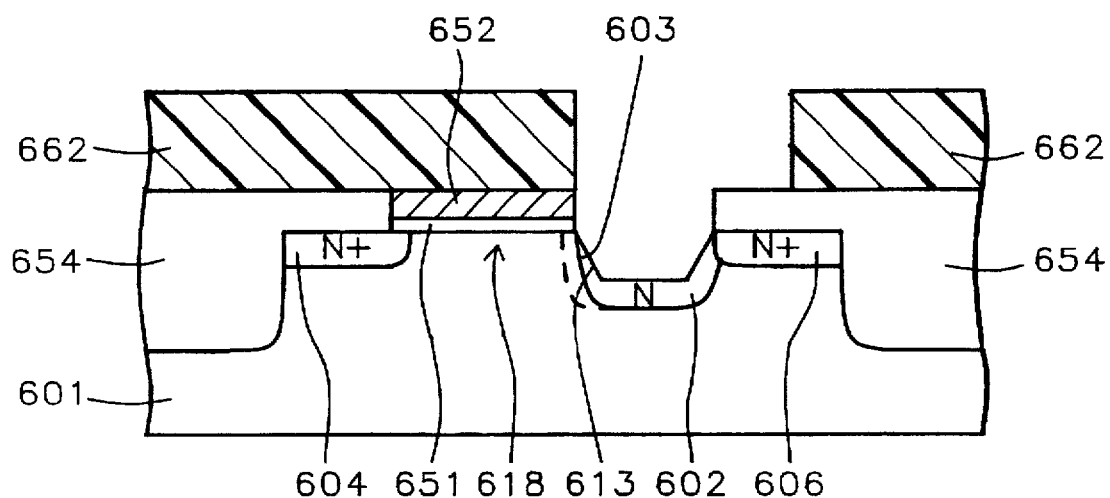
Figure 13E:
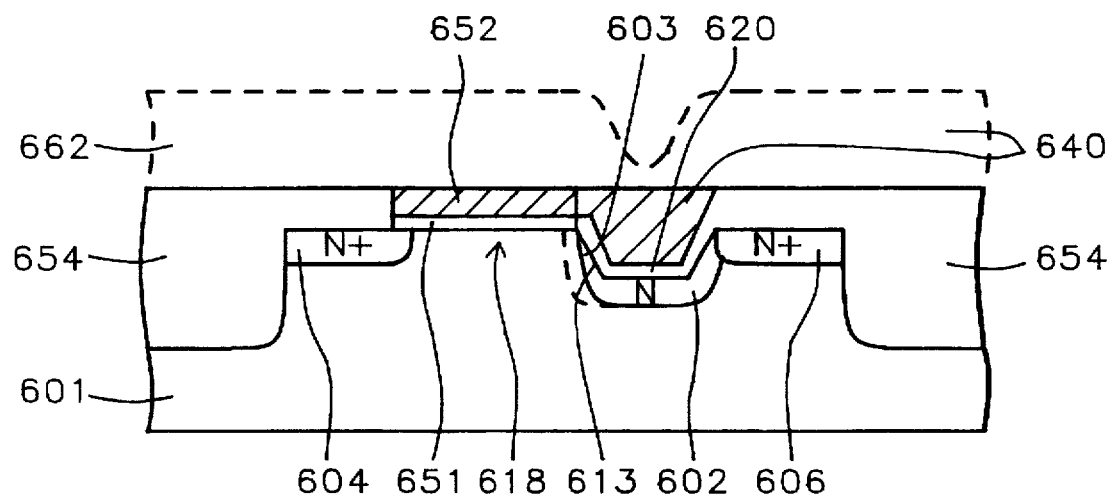
Figure 13F:
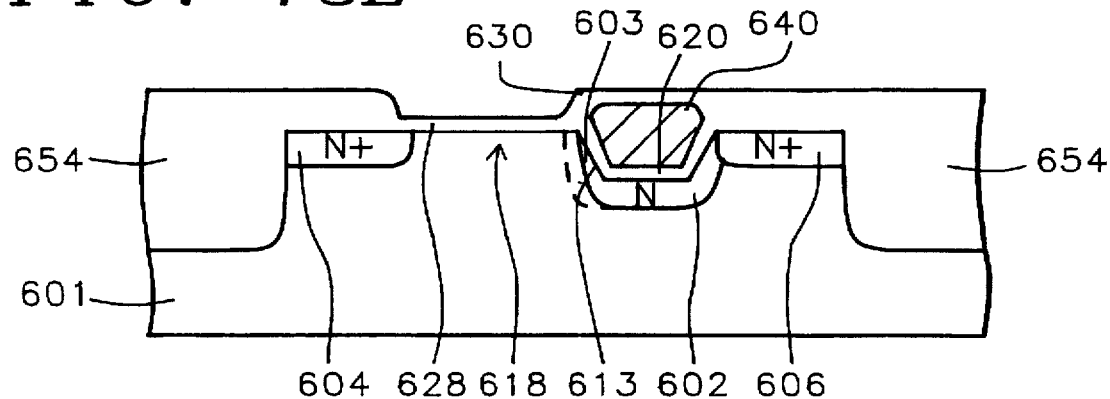
Figure 13G:
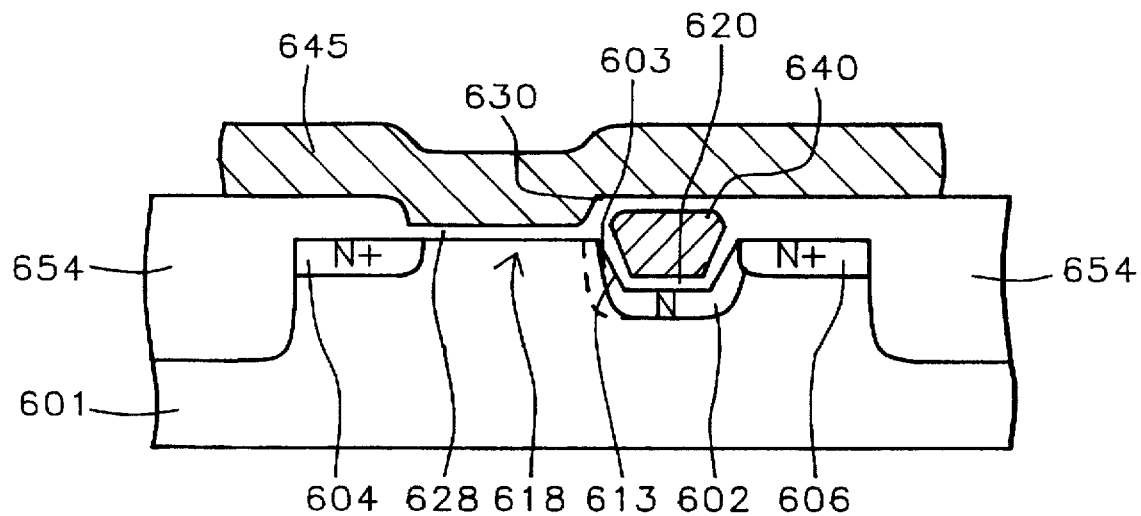
Figure 13H:
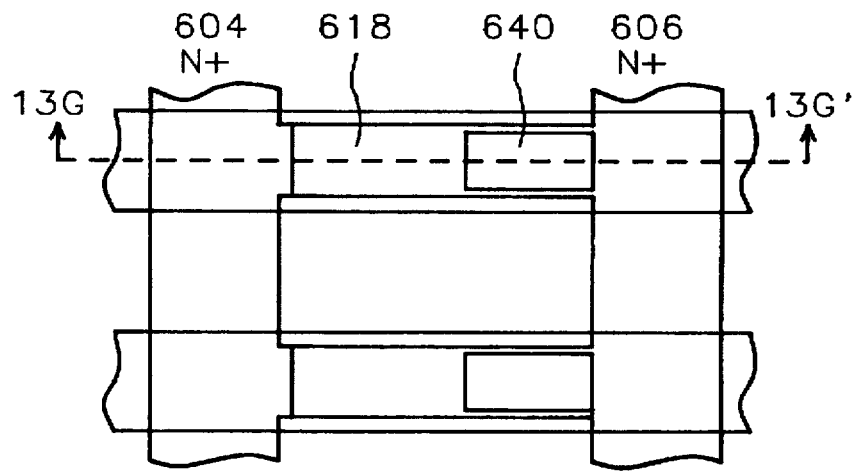
FIG. 13H is a top view of transistor 600d in a memory array, after completion of process.

FIG. 13A through FIG. 13G show a fabrication method for transistors 600d and 600e, which are also variations of transistor 600b. Immediately after formation of device isolation (shallow trench or LOCOS), the nitride film 652 still remains with a thickness of 50 nm, over the device area as shown in FIG. 13A. This nitride film is removed by using a photoresist mask for the source 604 and drain 606 regions in FIG. 13B. Then a CVD oxide film which is slightly thicker than the nitride film is deposited as shown by the dotted line in FIG. 13C, and followed by Chemical Mechanical Planarization. The planarization fills the hole over the diffusion layer provides an oxide thickness of at least 50 nm. To form the buried floating gate in the step region, the floating gate area is exposed with a photoresist mask 662 and the silicon is etched 100 nm–300 nm by gentle RIE, as shown in FIG. 13D. Multiple Arsenic implants, adjusting the tilted angle of implant and with different dosages, are performed to achieve shallow junction 603, which will have a surface concentration in the range of $1E17cm^3$ to $5E17cm^3$ for the step sidewall 613, while the bottom surface of step 602 will have a higher doping level but less than $5E19cm^3$. As an option, Boron can be implanted slightly deeper than the shallow Arsenic sidewall junction to create a higher electric field at the horizontal and vertical corner, which becomes the injection point. After photoresist mask 662 is removed, and the step silicon surface is cleaned, a thin oxide of 7–12 nm is thermally grown, also shown in FIG. 13E. A polysilicon layer, which should be slightly thicker than the step depth, is then conformally deposited by CVD, as shown by the dotted line in FIG. 13E. The polysilicon layer is planarized by chemical mechanical polish (CMP) and the surface is slightly recessed by dry RIE. The remaining filled polysilicon in the step region of FIG. 13E becomes the floating gate. After thermally growing a thin oxide layer, the nitride film 652 is selectively removed by Phosphoric acid or chemical dry etch. After cleaning the surface, oxide 628 (7 nm~15 nm thick) is thermally grown over select channel gate 618 and the coupling oxide 630, which is over the floating gate. Oxide 630 over the polysilicon is slightly thicker than oxide over the silicon substrate, due to the high growth rate of the doped polysilicon. The oxide layer in nitrided in an NO environment, and another slight oxidation is repeated to minimize pinholes. Instead of nitridation, a thin CVD nitride layer (about 6 nm) can be deposited, as shown in FIG. 13F. Polysilicon for the select gate is deposited conformally by CVD. The polysilicon layer is etched to separate adjacent select gates over the STI region, as illustrated in FIG. 13G. Thus, the memory cell transistor 600d is obtained. Normal FET processes follow, such as passivation, contact hole definition and metal wiring. The bird's eye view of the memory cell is shown in FIG. 13H.

Utilizing the same process, but eliminating the N+ drain formation in the previous design, the variation of high density cell 600e is obtained. High density memory arrays can be realized by placing many 600e-type transistors in series.

While the invention has been particularly shown and described with reference to the preferred embodiments thereof, it will be understood by those skilled in he art that various changes in form and details may be made without departing from the spirit and scope of the invention.

What is claimed is:

1. A method for fabricating an electrically programmable memory device which has efficiency of electron injection from the channel to floating gate comprising:

providing a substrate having source and drain region with a channel therebetween;

providing a floating gate structure over portions of said source and drain regions and said channel, which structure includes a dielectric layer and a conductor layer thereover;

said channel under said floating gate has both horizontal and vertical components; and after forming said vertical and horizontal components, an N- drain region is formed in self-alignment with the vertical channel step region's edge;

wherein the depth of said N- drain region is greater than said source region.

2. The method for fabricating an electrically programmable memory device of claim 1 wherein said horizontal and vertical components are a horizontal channel and a vertical channel, and the said vertical channel is adjacent to said drain region and said horizontal channel is adjacent to said source region which device provides in operation accelerated electrons in the horizontal channel are injected straight in the direction of momentum into the vertical channel and the vertical portion of said floating gate structure over said vertical channel.

3. The electrically programmable memory method of claim 2 said vertical channel is channel is 30 to 150 degrees when measured from the horizontal.

4. The electrically programmable memory method of claim 3 wherein said vertical channel is formed by etching in the early stages of a field effect device fabrication, between 20 to 100 nm in depth.

5. The electrically programmable memory method of claim 3 wherein said vertical channel is formed by etching in the early stages of a field effect device fabrication between 20 to 300 nm in depth.

6. The electrically programmable memory method of claim 5 wherein said vertical channel is formed using the same mask to define the vertical channel step; an ion from the group consisting of phosphorus, arsenic, and antimony is implanted to form the N-drain self aligned to the vertical channel step region.

7. The method of claim 6 wherein said floating gate is formed over said vertical channel step by forming a tunnel silicon oxide upon said channel and forming a first polysilicon layer thereover and patterning to form said floating gate.

8. The method of claim 7 wherein a stack gate memory cell is formed.

9. The method of claim 7 wherein a split gate memory cell is formed.

10. The method of claim 6 wherein a control gate is formed over said floating gate by depositing a composite dielectric layer over said first polysilicon layer and a second polysilicon layer thereover and patterning to form said control gate.

11. A method for fabricating an electrically programmable memory device which has efficiency of electron injection from the channel to floating gate comprising:

providing a semiconductor substrate having isolated surface regions therein;

providing source and drain regions with a channel therebetween within at least one of said isolated regions;

forming a vertical step within at least one of said isolated regions having said source and drain regions by etching into said substrate with its location between said source and drain and to a desired depth; implanting to form an N- region over at least said vertical step and in contact with either of said source and drain regions;

wherein said N- drain region is formed in self-alignment with the vertical step region's edge and the depth of said N- drain region is greater than the source region;

forming a floating gate structure over portions of said source and drain regions and said channel, which structure includes a dielectric layer and a conductor layer thereover; and said channel under said floating gate having both horizontal and vertical components.

12. The method of claim 11 wherein a control gate is formed over said floating gate by forming a composite dielectric layer over said floating gate; forming a polysilicon layer thereover and patterning said polysilicon layer to define the said control gate.

13. The method for fabricating an electrically programmable memory device of claim 11 wherein said horizontal and vertical components are a horizontal channel and a vertical channel, and the said vertical channel is adjacent to said drain region and said horizontal channel is adjacent to said source region which device provides in operation accelerated electrons in the horizontal channel are injected straight in the direction of momentum into the vertical channel and the vertical portion of said floating gate structure over said vertical channel.

14. The electrically programmable memory method of claim 11 said vertical channel is between 20 to 300 nm in depth.

15. The electrically programmable memory method of claim 11 the angle of said vertical channel is 30 to 150 degrees when measured from the horizontal.

16. The electrically programmable memory method of claim 11 wherein after forming said vertical channel and using the same mask to define the vertical channel step.

17. The method of claim 11 wherein said floating gate is formed over said vertical channel step by wherein said dielectric layer is made by forming a tunnel silicon oxide upon said channel and said conductive layer is formed by forming a first polysilicon layer thereover and patterning to form said floating gate.

18. The method of claim 11 wherein a stack gate memory cell is formed.

19. The method of claim 11 wherein a split gate memory cell is formed with the drain located at the bottom of the vertical step.

20. A method for fabricating an electrically programmable memory device which has efficiency of electron injection from the channel to floating gate comprising:

providing a semiconductor substrate having isolated surface regions therein;

forming a word line gate structure within at least on of said regions;

forming a source region adjacent to a word line gate structure;

forming an N- drain region adjacent to said word line gate structure but spaced from said source region;

forming a vertical step within at least one of said isolated regions having said N- drain region by etching into said substrate with its location between said source and drain and to a desired depth;

implanting to form a highly doped drain region within said N- drain region and to a depth greater than said N- region;

forming a contact to said source region to be a word line contact;

forming a floating gate structure over portions of said source and drain regions and said channel, which structure includes a dielectric layer and a conductor layer thereover; and said channel under said floating gate having both horizontal and vertical components.

21. A method for fabricating an electrically programmable memory device which has greater efficiency of electron injection from the channel to the floating gate comprising:

providing a semiconductor substrate having isolated surface regions therein;

providing source and drain regions with a channel therebetween within at least one of said isolated regions;

said source and drain regions are at a level below the surface of said isolated regions;

forming a vertical step within said channel and trench at least one of said isolated regions having said source and drain regions by etching into said substrate with its location between said source and drain and to a depth of more than 300 nm, implanting to form an N- region over at least vertical step and in contact with said drain region;

forming a floating gate structure over portions of said source and drain regions and said channel, which structure includes a dielectric layer and a conductor layer thereover;

said dielectric layer is formed on said step and said trench and said conductor layer is polysilicon and is deposited over said dielectric layer within said trench and without of said trench;

said polysilicon layer is planarized to leave only that portion of said layer that is within said trench to complete said floating gate structure; and said channel under said floating gate having both horizontal and vertical components.

22. The electrically programmable memory method of claim 21 said vertical channel is channel is 30 to 150 degrees when measured from the horizontal.

23. The electrically programmable memory method of claim 21 wherein said vertical channel is formed by etching to a depth of between 100 to 300 nm.

24. The method of claim 1 wherein said electrically programmable memory device is a split gate device with the drain located at the bottom of the vertical step.

25. The method of claim 1 wherein said conductor layer is separated into two sections separated by a dielectric layer in the vertical step area.

26. The method of claim 1 wherein said N- region has a conductivity of less than about 1 E 18 cm$^{-3}$.

27. The electrically programmable memory method of claim 20 wherein said vertical channel is a channel 30 to 150 degrees when measured from the horizontal.

28. The electrically programmable memory method of claim 20 wherein said vertical channel is formed by etching to a depth of between 100 to 300 nm.

29. A method for fabricating an electrically programmable memory device which has efficiency of electron injection from the channel to floating gate comprising:

provivding a semiconductor substrate having isolated surface regions therein;

forming a vertical step within at least one of said isolated regions by etching into said substrate to a desired depth to form a trench;

implanting to form a N+ region on the horizontal surface above said vertical step and a N+ region at the bottom horizontal surface within the said trench to act as source and drain regions;

forming a floating gate structure over portions of said source and drain regions and the channel therebetween, which structure includes a dielectric layer and a conductor layer thereover; and said channel under said floating gate having both horizontal and vertical components.

30. The method of claim 29 wherein said drain is within the trench and the source is on said horizontal surface above said vertical step.

31. The method of claim 29 wherein said source is within the trench and the drain is on said horizontal surface above said vertical step.

32. The method of claim 29 wherein said forming a floating gate structure includes the deposition of three polysilicon layers.

* * * * *